United States Patent
Kishimoto et al.

(10) Patent No.: US 7,355,257 B2
(45) Date of Patent: Apr. 8, 2008

(54) SEMICONDUCTOR SUPERJUNCTION DEVICE

(75) Inventors: Daisuke Kishimoto, Fukishima (JP); Susumu Iwamoto, Nagano (JP); Katsunori Ueno, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 189 days.

(21) Appl. No.: 11/370,188

(22) Filed: Mar. 8, 2006

(65) Prior Publication Data
US 2006/0256487 A1 Nov. 16, 2006

(30) Foreign Application Priority Data
Mar. 8, 2005 (JP) .............................. 2005-064376

(51) Int. Cl.
*H01L 31/00* (2006.01)
*H01L 23/58* (2006.01)
(52) U.S. Cl. .................. 257/409; 257/487; 257/491
(58) Field of Classification Search ................ 257/458, 257/341
See application file for complete search history.

(56) References Cited

U.S. PATENT DOCUMENTS

| | | | |
|---|---|---|---|
| 6,040,600 A | | 3/2000 | Uenishi et al. |
| 6,097,063 A | | 8/2000 | Fujihira |
| 6,677,626 B1 | * | 1/2004 | Shindou et al. ............. 257/266 |
| 7,176,524 B2 | * | 2/2007 | Loechelt et al. ............ 257/341 |
| 2005/0006699 A1 | | 1/2005 | Sato et al. |

FOREIGN PATENT DOCUMENTS

| | | |
|---|---|---|
| EP | 1 039 548 A2 | 9/2000 |
| JP | 9-266311 A | 10/1997 |
| JP | 10-223896 A | 8/1998 |
| JP | 2000-504879 A | 4/2000 |
| JP | 2003-124465 A | 4/2003 |
| JP | 2004-342660 A | 12/2004 |

OTHER PUBLICATIONS

Fujihira, Tatsuhiko; "Theory of Semiconductor Superjunction Devices." Jpn. J. Appl. Phys. vol. 36. Oct. 1997. pp. 6254-6262. JAPAN.
Sze, S.M.; "Semiconductor Devices—Physics and Processing Technology." 1987. pp. 33, Figure 3. JAPAN.
Sakaki, Hiroyuki; "Scattering Suppression and High-Mobility Effect of Size Quantized Electrons in Ultrafine Semiconductor Wire Structures." JAPAN. Jpn. J. of Appl. Phys. vol. 19, No. 12. Dec. 1980. pp. L735-L738. JAPAN.

* cited by examiner

*Primary Examiner*—Mark A. Robinson
*Assistant Examiner*—Bilkis Jahan
(74) *Attorney, Agent, or Firm*—Rossi, Kimms & McDowell LLP

(57) ABSTRACT

A semiconductor superjunction device has a superjunction structure formed in a drift region of the device. The superjunction structure has alternately arranged n-type regions and p-type semiconductor regions layered parallel with the drift direction of carriers, permitting current flow when turned ON and depleting when turned OFF. It also includes a first intrinsic semiconductor region between the n-type and p-type regions. The first intrinsic semiconductor region and the n-type and p-type regions sandwiching the first intrinsic semiconductor region forming a unit. A plurality of units are repetitively arranged to form a repetitively arranged structure. The value of mobility of one of electrons in the n-type region or holes in the p-type region is equal to or less than half the value of mobility of corresponding to one of electrons or holes in the first intrinsic semiconductor region. The superjunction structure eliminates the lower limit that prevents further narrowing of the widths of the n-type and p-type regions to further improve the tradeoff relationship between increasing the breakdown voltage and reducing the on-resistance.

19 Claims, 12 Drawing Sheets

RonA Plots FIG. 3
▲ (dw=0)

● RonA Plots FIG. 13
(dw=6 nm for all)

n⁻ Region

SEMICONDUCTOR SUPERJUNCTION DEVICE

BACKGROUND

For obtaining a high breakdown voltage in a high breakdown voltage semiconductor element, the drift region of the element must be made to have high resistivity so as to correspond to high breakdown voltage. Moreover, the width in the direction of the main current path needs to be large. This increases the voltage drop more in the section of the drift region of the element having higher breakdown voltage, making the on-voltage higher (i.e., larger on-resistance). In other words, there is a tradeoff relationship between increasing the breakdown voltage and reducing the on-resistance. Therefore, it is generally considered that both the breakdown voltage and the on-resistance cannot be easily improved.

One way of solving the above problem is to use a semiconductor superjunction device. Known semiconductor superjunction devices will be briefly explained below. For example, JP-A-9-266311 (Reference 1) discloses a semiconductor superjunction structure having parallel p-n layers in the drift region. In the parallel p-n layers, thin current path regions with the conductivity type same as that of carriers and regions with the conductivity type opposite to that of the thin current path regions are alternately laminated or layered. Both regions are arranged parallel to the drift direction of the carriers (i.e., the direction of the current path) with impurity concentrations made higher than that in the drift region. This allows current to flow in the current path region with the impurity concentration determined to be high, by which the on-voltage is decreased, and in the off state, all the parallel p-n layers are depleted to achieve the object of obtaining higher breakdown voltage.

Moreover, JP-T-2000-504879 discloses solving the problem similar to the problem described in Reference 1, in a device such as a MOSFET or an IGBT. Here, the device is provided as a field effect semiconductor device having in a drift region (inner zone), a superjunction structure provided with p-zones (depletion zones), and n-zones (complementary depletion zone) with amounts of dopants equal to each other.

Furthermore, JP-A-2003-124465 discloses a superjunction structure provided with parallel p-n layers having the function similar to that of the p-n layers disclosed in Reference 1, but formed in concentric circles. No end faces of the respective p-regions and n-regions, however, are presented. This eliminates electric field concentration at the boundary section between the region of the parallel p-n layers and a peripheral structural section to largely improve the tradeoff relation between the breakdown voltage and an on-voltage.

Still further, JP-A-10-223896 discloses a high breakdown voltage semiconductor device having excellent on-voltage and breakdown voltage characteristics by forming a superjunction structure made up of a repeating structure of p-n layers, each having a fine width of the order of micrometers in the drift region.

Moreover, JP-A-2004-342660 discloses a power MOSFET having a superjunction structure formed with the widths of respective n-type pillar layer and p-type pillar layer, formed in a sidewall of a trench, considerably reducing its size. Here, the channel density of the structure can be increased. This makes low on-resistance well compatible with high breakdown voltage, as well as further improving the on-resistance.

Furthermore, Tatsuhiko Fujihira, *Theory of Semiconductor Superjunction Devices*, Japanese Journal of Applied Physics, Vol. 36 (1997) pp. 6254-6262, discloses a theoretical analysis of breakdown voltage and on-resistance of a semiconductor device provided with a superjunction structure.

All the above-described superjunction structures are based on the following principle. A width of each linear region (a width in the direction perpendicular to the drift direction of carriers) in the parallel p-n region is made narrower to increase the arrangement density of each of p-type and n-type regions in the superjunction structure in the drift region. Further, the impurity concentrations in the p-n region are increased to make the low on-voltage characteristic and the high breakdown voltage characteristic compatible. Each of the related superjunction structures can increase the upper limit of doping concentration with impurities by further narrowing the region widths of the respective p-type and n-type regions arranged in parallel to obtain the desired result of high breakdown voltage and low on-resistance. Nonetheless, the following limitation exists with respect to improving that tradeoff relationship on the extrapolation of such principle. Increasing the impurity concentration by narrowing the region width for reducing the on-resistance can cause saturation to gradually appear in the way of the reduction of the on-resistance with the presence of the limit of the region width (impurity concentration value) that causes increase in the on-resistance for further narrowed region widths.

The reason for the increase in the n-resistance is considered to be due to the influence of decreasing mobility of the carriers becoming so large in the region with the impurity concentration above the threshold value, interrupting the reduction of on-resistance, namely actually increasing the on-resistance. For example, in the case of silicon semiconductor, it is known that an impurity concentration above $5 \times 10^{16}$ cm$^{-3}$ begins to considerably decrease the mobility of conduction carriers, whether electrons or holes, and the impurity concentration reaching $1 \times 10^{18}$ cm$^{-3}$ decreases the mobility by approximately one order of magnitude as compared with the mobility in an intrinsic semiconductor. See for example FIG. 3 in 2.1.1 of S. M. Sze, *Semiconductor Devices*, Wiley (Sangyo Tosho-sha, Japanese translation). On the basis of the publicly known fact, the cause of the decrease in the mobility is considered to be due to scattering resulting from crystalline defects caused by ionized impurity scattering due to doped impurities and highly concentrated impurities. That is, referring to FIGS. 11A and 11B, when the width dp of the p-region 1 and the width dn of the n-region 2 in the parallel p-n region shown in FIG. 11A are narrowed to as shown in FIG. 11B, with the impurity concentrations of the respective p-type and n-type regions increased for the purpose of improving both the breakdown voltage and the on-resistance, scattering caused by ionized impurities and crystalline defects due to the scattering are increased to decrease mobility of carriers. This effect gradually grows with the decrease in the region widths and the increase in the impurity concentrations in both regions, interrupting the reduction of the on-resistance.

Furthermore, in a normal p-n junction, across the junction between the p-type region 1 and the n-type region 2 and adjacent to each other, a built-in voltage relating to the impurity concentrations in both regions is always presented with a certain small width without applying any bias voltage. By the built-in voltage, a depletion layer is formed with a certain small width (in FIGS. 11A and 11B, the width of the depletion layer spreading on both sides of the junction is shown by a double headed arrow 4). Therefore, when the respective region widths (dp and dn) of both the p-type region 1 and the n-type region 2 are minimized further than the widths at which reduction in the on-resistance is interrupted, the p-n junction is brought into a state in which the width 4 occupied by the depletion layer cannot be negligible. In this case, large resistance of the depletion layer narrows the path regions of effective on-currents and transit regions of carriers in the p-type region 1 and the n-type region 2. As a result, the on-resistance begins to increase. Moreover, further narrowed region widths (dp and dn) cause the whole bulk to be always left depleted. This makes current flow as little as that of an intrinsic semiconductor, which results in an abrupt increase in the on-resistance.

As previously explained when improving the tradeoff relationship between increasing the breakdown voltage and reducing the on-resistance by narrowing the region widths of respective p-type and n-type regions, there is a limit as to how much they can be narrowed before the improvement starts decreasing.

Accordingly there is a need to remove the lower limit so that the tradeoff relationship can be further improved. The present invention addresses this problem.

SUMMARY OF THE INVENTION

The present invention relates to a semiconductor superjunction device that is applicable to devices such as a MOSFWT (MOS Field Effect Transistor), an IGBT (Insulated Gate Bipolar Transistor), a bipolar transistor, and a diode, with improvements in high breakdown voltage and low on-resistance characteristics.

The semiconductor superjunction device includes a semiconductor substrate, a drift region formed in the substrate, and a superjunction structure formed in the drift region. The superjunction structure has alternately arranged n-type regions and p-type regions both layered parallel with the drift direction of carriers to allow current flow in an ON state and to deplete in an OFF state. The superjunction structure further includes a first intrinsic semiconductor region between the n-type region and the p-type region, the first intrinsic semiconductor region, the n-type region, and the p-type region forming a unit, and a repetitive structure comprising a plurality of units that are repetitively arranged.

The superjunction structure can further include a second intrinsic semiconductor region formed inside one of the n-type region or the p-type region forming the unit of the repetitive structure. More specifically, The superjunction structure can have a cross-sectional pattern on a plane taken parallel with the principal surface of the semiconductor substrate comprising concentric circles with a plurality of ring-shaped regions. The one of n-type or p-type region can have a column configuration, namely having a ring-shaped cross section. The first intrinsic semiconductor region also can have a column configuration, namely having a ring-shaped cross section. The other of the n-type or p-type region can have a column configuration, also having a ring-shaped cross section, arranged or concentrically arranged in the order from a central section toward a peripheral section. The second intrinsic semiconductor region having column configuration with a substantially circular cross section can be formed concentrically at the central section. One of the n-type or p-type region can form the outermost peripheral section.

Alternatively, the second intrinsic semiconductor region can be formed between the n-type or p-type regions of adjacent units of the repetitive structure. Alternatively, the second intrinsic semiconductor region can be positioned between two adjacent layers of the same conductivity type or inside one of the n-type or p-type region.

The superjunction structure can be layered perpendicular to the principal surface of the semiconductor substrate and are aligned so that a cross-sectional pattern on a plane taken parallel with the principal surface comprises a plurality of rectangles arranged in parallel.

The device can further include a channel stopper region arranged on the outside of the column structure or the superjunction structure.

The value of mobility of one of electrons in the n-type region and holes in the p-type region is equal to or less than half the value of mobility of corresponding one of electrons or holes in the first or second intrinsic semiconductor region. The mobility of carriers in at least one of the first or second intrinsic semiconductor region can be equal to or more than 90% compared with the theoretical mobility of carriers in an intrinsic semiconductor region.

The impurity concentration in the n-type region taken as $n_2$, the width of the n-type region in the direction perpendicular to the drift direction of carriers in the n-type region taken as dn, the impurity concentration in the p-type region taken as $p_1$, the width of the p-type region in the direction perpendicular to the drift direction of carriers in the p-type region taken as dp, the width of the first intrinsic semiconductor region taken as di, $(dn+dp+2\times di)/2$ set as $(dn+dp+2\times di)/2=d'$, and the donor concentration Nd in the superjunction structure given as $$Nd = 1.41 \times 10^{12} \cdot \alpha^{7/6} \cdot d^{-7/6} (\text{cm}^{-3}),$$

where $\alpha$ represents a coefficient ($0<\alpha<1$) and d represents the width (the width in the direction perpendicular to the drift direction) of a current path (in the n-type semiconductor region) in the superjunction structure, the impurity concentration $n_2$ in the n-type semiconductor region and the impurity concentration $p_1$ in the p-type semiconductor region satisfy $n_2 \leq d' \times Nd/dn$ and $p_1 \leq d'' \times Nd/dp$, respectively, and satisfy $n_2 \times dn = p_1 \times dp$.

The unit of the repetitive structure can have a total width equal to or less than 0.5 µm. The width of the second intrinsic semiconductor region in the unit of the repetitive structure can have, with de Broglie wavelength of a carrier drifting in the region taken as $\lambda$, a magnitude within the range of $\lambda/2$ to $3\lambda$, and the carriers form one-dimensional electron gas when the carriers are electrons and form one-dimensional hole gas when the carriers are holes.

The substrate can be composed of a silicon single crystal as a semiconductor material, at least one of the n-type region or the p-type region can have an impurity concentration equal to $1 \times 10^{17}$ cm$^{-3}$ or more, and one of the first intrinsic semiconductor region or the second intrinsic semiconductor region can be composed of one of an n-type semiconductor or a p-type semiconductor having an impurity concentration equal to $1 \times 10^{16}$ cm$^{-3}$ or less.

When the superjunction structure is turned ON, at least one of a relation between a density $J_{n3}$ of electron current flowing in at least one of the first or second intrinsic semiconductor region or a density $J_{n2}$ of electron current flowing in the n-type region can be expressed as $J_{n3} \geq J_{n2}$, or a relation between a density $J_{p3}$ of hole current flowing in at least one of the first or second intrinsic semiconductor region or a density $J_{p1}$ of a hole current flowing in the p-type region can be expressed as $J_{p3} \geq J_{p1}$, is satisfied.

The device further can include a MOSFET structure having source regions of one of a p-type or a n-type over the superjunction structure, wherein the superjunction structure is positioned opposed to the MOSFET structure at a position at which carriers flow out from the source regions through channel regions thereof.

The impurity in the n-type region of the superjunction structure can be one of antimony or arsenic.

DETAILED DESCRIPTION

Although the semiconductor superjunction device according to the invention is explained with reference to the drawings, namely with a trench gate MOSFET taken as a specific example, the present invention is not to be limited only to the examples provided or illustrated herein. Moreover, although specific examples of semiconductor devices having a silicon substrate, however, other semiconductor materials can be used.

Figure 1A:
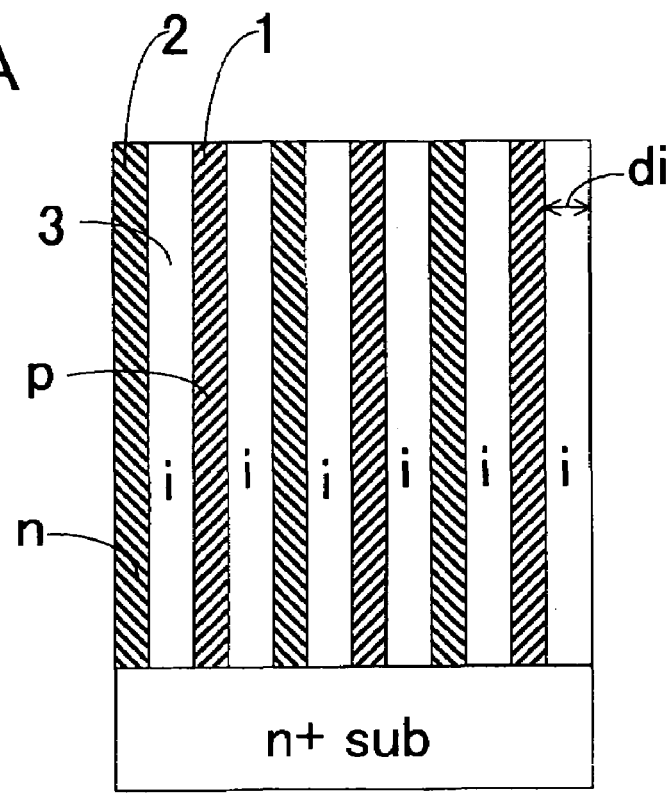
FIG. 1A schematically illustrates a cross section of a principal part of a superjunction structure according to the invention.

Referring to FIG. 1A, the semiconductor superjunction structure has a repeating structure of a first intrinsic semiconductor region 3 provided between an n-type region 2 and a p-type region 1 alternately arranged adjacent to each other. With the widths of the regions 1, 2, and 3 taken as dn, dp, and di, respectively, the total of widths of the respective regions (taken as a unit) is expressed as d'=(dn+dp+2 di)/2. The semiconductor superjunction structure according to the invention is provided with an arrangement in which, for the impurity concentration Nd obtained as a result of the above substitution, the impurity concentration $n_2$ in the n-type region 2 is expressed as $n_2 \leq d' \times Nd/dn$, the impurity concentration $p_i$ in the p-type region 1 is expressed as $p_1 \leq d' \times Nd/dp$, and $n_2 \times dn = p_1 \times dp$. In the arrangement, $n_2$ and $p_1$ desirably take the maximum values allowed in the above respective inequalities. The d' is substituted for d in the equation (3.5) in the Fujihira's paper as follows:

$$q \cdot Nd \cdot d = 2 \cdot \epsilon s \cdot |Ez|\max = 2 \cdot \alpha \epsilon s \cdot Ec \ldots \quad (1),$$

where q is the elementary charge ($1.6 \times 10^{-19}$(C)), Nd is donor concentration in the n-type current path in the superjunction structure (cm$^{-3}$), a is a coefficient ($0<\alpha<1$), d is the width (the width in the direction perpendicular to the drift direction) of the n-type current path in the superjunction structure (cm), Ec is the maximum critical electric field strength of the semiconductor (silicon) (V/cm), $\epsilon s$ is the relative dielectric constant of the semiconductor (silicon), and |Ez|max is the maximum electric field strength in the z-direction (V/cm).

Since the superjunction structure is a bulk section (a drift region) of a semiconductor device, the invention can be applied to both the vertical and lateral-types of devices. In a vertical-type device, any device structures can be built on the top surface and the bottom surface of the wafer. For example, for such device structures, those such as a diode, a BJT (bipolar junction transistor), a thyristor, an insulated gate thyristor, a MOSFET (MOS gate field-effect transistor), and an IGBT (insulated gate bipolar transistor), can be considered. In the insulated gate thyristor, MOSFET, or IGBT, its gate structure can be of any of a planer type or a trench-gated type. Particularly in an IGBT, the structure on the bottom surface can be any of an NPT (non-punch-through) structure or an FS (field stop) structure of a thin wafer. Moreover, even in the case of a lateral device, structures built at both ends of the superjunction structure are not particularly limited. Furthermore, in the explanations in the following, conduction types represented as the p-type and the n-type can be exchanged or swapped with each other.

Referring to FIG. 1A, in Example 1, the superjunction structure has a cross-sectional pattern having a plurality of rectangles arranged parallel and is that of a vertical element with an assumed breakdown voltage of 600 V, with a cross-sectional plane parallel with the principal surface of a semiconductor substrate provided with a stripe-like pattern. In the superjunction structure, (dp+dn+2×di)=0.1 µm, with dp=dn=0.02 µm, and the width of the first intrinsic semiconductor region di is taken as di=0.03 µm.

Figure 11A:
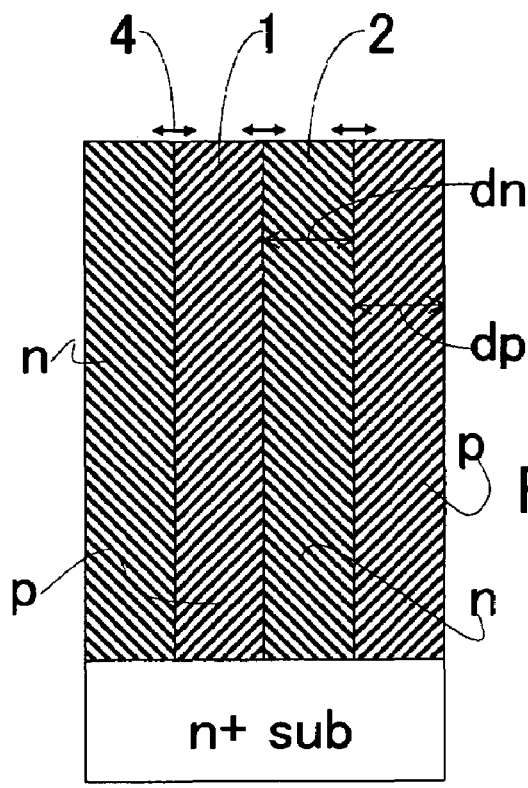
FIG. 11A schematically illustrates a cross section of a principal part of a related superjunction structure.

Referring to FIG. 11, which illustrates the related structure taken for the purpose of comparison with Example 1, the width of each of the n-type region 2 and the p-type region 1 is taken as d'=dp=dn=0.05 µm. Then, the impurity concentration Nd, derived from Equation (1) as the equation (4.1) given in the above Fujihira's paper, is given as $1\times10^{18}$ cm$^{-3}$. A device simulation with the above values was carried out by assuming an n-type conduction unipolar device with the related structure shown in FIG. 11A, with an assumed breakdown voltage of 600V. The results showed that the on-resistance value RonA increases up to 10 mΩcm$^2$ or above at a current density of 50 A/cm$^2$ or 55 A/cm$^2$, as shown in FIG. 12 (logarithmic scales, with the region widths in the superjunction structure on the horizontal axis and the on-resistance values on the vertical axis), showing degraded characteristics.

Figure 12:
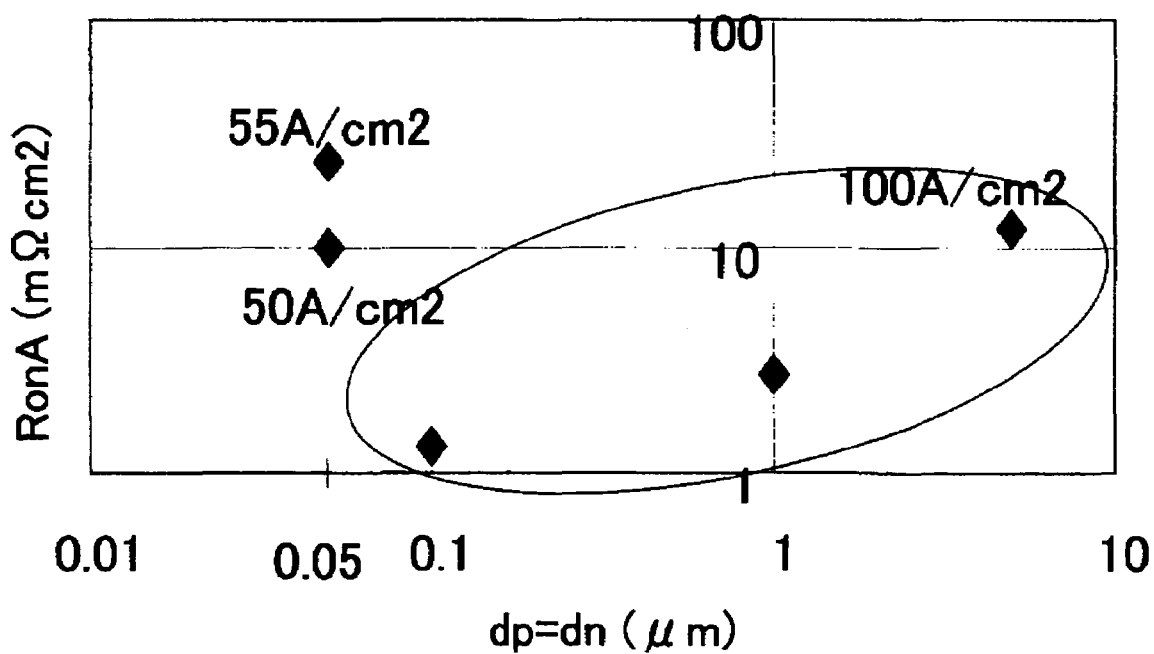
FIG. 12 is a characteristic diagram showing the relationship between the on-resistance and the region width of a related superjunction structure.

Referring to FIG. 12, the on-resistance RonA (mΩcm$^2$) as a result of the device simulation was plotted by varying the region widths dp and dn of the p-type region and the n-type region, respectively, in the parallel p-n layers. In FIG. 12, both the region widths (µm) and the on-resistance RonA (mΩcm$^2$) were taken in logarithmic scales on the horizontal axis and the vertical axis, respectively. The number 2 in the unit "cm2" in the drawings means square, i.e., "cm$^2$". The impurity concentrations in the parallel p-n layers were determined according to the equation (4.1) given in the above shown Fujihira's paper. Unless otherwise notified, impurity concentrations is to be determined in the same way in the following explanations. The equation (4.1) given in the Fujihira's paper will be given as follows:

$$Nd=1.41\times10^{12}\cdot\alpha^{7/6}\cdot d^{-7/6}(\text{cm}^{-3}) \quad (2),$$

where Nd, α and d represent a donor concentration in the superjunction structure, a coefficient (0<α<1) and a width (a width in the direction perpendicular to the drift direction) of a current path (in an n-type region) in the superjunction structure, respectively.

FIG. 12 shows that the on-resistance reduction becomes interrupted when the region width approaches approximately dp=dn=0.5 µm and the on-resistance RonA (mΩcm$^2$) abruptly increases below the region width of about dp=dn=0.05 µm. In FIG. 12, plots encircled with an ellipse show the relationship between the width and the on-resistance at a current density of 100 A/cm$^2$, and the other plots show the on-resistance values at current densities of 50 A/cm$^2$ and 55 A/cm$^2$ for the region width of 0.05 µm.

Figure 3:
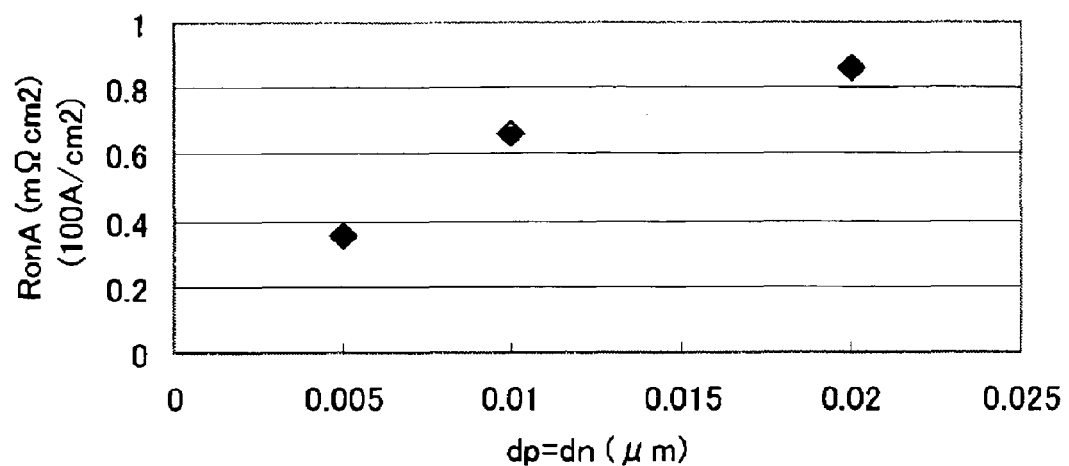
FIG. 3 is a characteristic diagram showing the relationship between the on-resistance and the region width in the superjunction structure of FIG. 1A, with plots taken from Examples 1, 2 and 3.

In comparison, as shown in FIG. 3 (illustrating the relationship between the region width and the on-resistance value as a result of a device simulation), in Example 1, the on-resistance value RonA becomes 0.86 mΩcm$^2$ when dp and dn are given as dp=dn=0.02 µm (for a current flowing with a current density of 100 A/cm$^2$). Thus, Example 1 can obtain a considerably low on-resistance value RonA in comparison with the on-resistance values of 10 mΩcm$^2$ or above in the above related superjunction structure. The impurity concentration $n_2$ in the n-type region 2 is given as $n_2$=d'×Nd/dn=2.5×10$^{18}$ cm$^{-3}$, which is high, 2.5 times higher than the impurity concentration Nd in the related superjunction structure that is given as Nd=1×10$^{18}$ cm$^{-3}$.

Around the boundary between the n-type region 2 and the first intrinsic semiconductor region 3, calculated current densities $J_2$ and $J_3$ in the n-type region 2 and the first intrinsic semiconductor region 3 are given as $J_2$≈90 A/cm$^2$ and $J_3$≈40 A/cm$^2$, respectively. With the region width of such levels in the superjunction structure, the current density in the n-type region 2 is still higher than that in the first intrinsic semiconductor region 3. However, it is known that, only by keeping the current density of $J_3$≈40 A/cm$^2$ in the first intrinsic semiconductor region 3, the desired result is ensured as to reduce the on-resistance corresponding to an amount of the kept current density.

Around the boundary between the n-type region 2 and the first intrinsic semiconductor region 3 in Example 1, the value of electron mobility in the n-type region 2 is 187 cm$^2$/Vs when the impurity concentration $n_2$ is given as $n_2$=2.5×10$^{18}$ cm$^{-3}$, and the value of electron mobility in the first intrinsic semiconductor region 3 is 1500 cm$^2$/Vs. From this, it is known that the electron mobility in the n-type region 2 is one-half or below the mobility in the first intrinsic semiconductor region 3.

In Example 2, the width of the unit is kept as (dp+dn +2 di)=0.1 µm, while the widths are at dp=dn=0.01 µm and di=0.04 µm. In the related structure shown in FIG. 11A, like in the related structure used for comparison with the structure of Example 1, d' is taken as d'=dp=dn=0.05 µm. In Example 2, the device simulation gave the value of on-resistance RonA as 0.66 mΩcm$^2$ (for a current flowing with a current density of 100 A/cm$^2$), by which it was known that a considerably low value of on-resistance can be obtained in comparison with that obtained in the Example 1. The impurity concentration $n_2$ in the n-type region 2 is given as $n_2$=d'·Nd/dn=5×10$^{16}$ cm$^{-3}$. Around the boundary between the n-type region 2 and the first intrinsic semiconductor region 3, the current densities $J_2$ and $J_3$ in the n-type region 2 and the first intrinsic semiconductor region 3 are given as $J_2$≈120 A/cm$^2$ and $J_3$≈140 A/cm$^2$, respectively. From this, it is known that the current density in Example 2 is higher in the first intrinsic semiconductor region 3 than in the n-type region 2. As a result, in Example 2, the on-resistance RonA is reduced even further.

Around the boundary between the n-type region 2 and the first intrinsic semiconductor region 3 in Example 2, the value of electron mobility in the n-type region 2 is 140 cm$^2$/Vs when the impurity concentration $n_2$ is given as $n_2$=5×10$^{18}$ cm$^{-3}$, and the value of electron mobility in the first intrinsic semiconductor region is 1500 cm$^2$/Vs. From this, it is known that the electron mobility in the n-type region 2 is one-half or below the mobility in the first intrinsic semiconductor region 3.

In Example 3, the width of the unit is kept as (dp+dn+2 di)=0.1 µm and the widths are as dp=dn=0.005 µm and di=0.045 µm. In the related structure shown in FIG. 11A, like in the related structures used for comparison with the structures of Examples 1 and 2, d' was taken as d'=dp=dn=0.05 µm. The impurity concentrations $n_2$ and $p_1$ of the n-type and p-type impurities, respectively, reached up to $n_2=p_1=1\times10^{19}$cm$^{-3}$. As to electron mobility, with the doping concentration of $1\times10^{19}$cm$^{-3}$, electron mobility is below 100 cm$^2$/Vs, which is more than one order lower than the electron mobility in non-doped silicon. According to Example 3, however, the device simulation gave the value of on-resistance RonA as 0.35 mΩcm$^2$ (for a current flowing with a current density of 100 A/cm$^2$) when the width dp and dn were taken as dp=dn=0.005 μm, by which it was known that even a lower on-resistance value RonA can be obtained in comparison with that obtained in the Example 2.

Around the boundary between the n-type region 2 and the first intrinsic semiconductor region 3, the current densities $J_2$ and $J_3$ in the n-type region 2 and the first intrinsic semiconductor region 3 are given as $J_2 \approx 700$ A/cm$^2$ and $J_3 \approx 1400$ A/cm$^2$, respectively. From this, it is known that the current density in Example 3 is higher in the first intrinsic semiconductor region 3 than in the n-type region 2. As a result, example 3 provides more pronounced reducing effect of the on-resistance RonA.

Around the boundary between the n-type region 2 and the first intrinsic semiconductor region 3 in Example 3, the value of electron mobility in the n-type region 2 is 95 cm$^2$/Vs when the impurity concentration $n_2$ is given as $n_2=1\times10^{19}$cm$^{-3}$, and the value of electron mobility in the first intrinsic semiconductor region is 1500 cm$^2$/Vs. From this, it is known that the electron mobility in the n-type region 2 is one-half or below the mobility in the first intrinsic semiconductor region 3. Moreover, the value of electron mobility in the first intrinsic semiconductor region 3 was obtained by taking into consideration that the region 3 actually includes not only a theoretical intrinsic semiconductor region without impurity but also the region lightly doped with an n-type dopant, such as phosphorus, arsenic or antimony. Thus, the region 3 is regarded as also including the region where the carrier mobility is 1350 cm$^2$/Vs, which is 90% or more as compared with 1500 cm$^2$/Vs carrier mobility in a theoretical intrinsic semiconductor region, i.e., the region with an n-type impurity concentration up to $1\times10^{16}$cm$^{-3}$.

The on-resistance values RonA versus the region widths obtained in the above Examples 1 to 3 are plotted in FIG. 3. As is apparent from the comparison with FIG. 12, which also show the on-resistance values RonA versus the region widths in the related superjunction structure, in the related superjunction structure, the on-resistance value RonA could not break even the 1 mΩcm$^2$ barrier; rather it increased dramatically when the region width was narrowed down to dp=dn=0.05 μm. In comparison, in FIG. 3, even with the region widths brought to 0.05 μm or below, the on-resistance values are still reduced. With the region width at 0.005 μm, it is known that the on-resistance value is decreased down to 0.35 mΩcm$^2$ (for a current flowing with a current density of 100 A/cm$^2$) in Example 3.

In Examples 1 to 3, it was shown that the performance of the superjunction structure is improved by fixing the width of the unit as (dp+dn+2 di)=0.1 μm, taking the widths dn and dp as dp=dn, and making the value of dn=dp small. In Example 4, the width of the unit is increased, namely (dp+dn+2 di)=0.2 μm. With d'=0.1 μm and the impurity concentration Nd derived from the equation (4.1) in the above Fujihira's paper is given as $4.3\times10^{17}$cm$^{-3}$. Here, the as-is value of d' is used for dp as dp=0.1 μm. Only the width dn of the n-type region 2 is thinned to be dn=0.0043 μm and the impurity concentration $n_2$ in the n-type region 2 is made as $n_2$=d'Nd/dn=$1\times10^{19}$cm$^{-3}$. Since the width of the unit is taken as (dp+dn+2 di)=0.2 μm, di is consequently determined as 0.04785 μm. The impurity concentration in the n-type region 2 and an environment of presence of the first intrinsic semiconductor region 3 on each side of the n-type region 2 are the same as those in Example 3. Therefore, as far as at least the n-type conduction device is concerned, behavior of the electron current flowing in the n-type region 2 and the electron current flowing in the first intrinsic semiconductor region 3 by bypassing the n-type region 2 is the same as those in the structure according to Example 3.

In Example 4, however, the density of stripes per unit area decreases by an increased amount of (dp+dn+2 di) to increase the on-resistance RonA. Specifically, the stripe density is reduced by half as compared with that in Example 3, which inversely doubles the on-resistance RonA to 0.70 mΩcm$^2$ (for an electric current flowing with a current density of 50 A/cm$^2$). However, the on-resistance RonA evaluated for an electric current flowing with a current density of 100 A/cm$^2$, although increases a little, do not exceed 0.70 mΩcm$^2$. Therefore, in comparison with the on-resistance value of 1.33 mΩcm$^2$ (for an electric current flowing with a current density of 100 A/cm$^2$) shown in FIG. 12 as that at the region width of dn=dp=0.1 μm in the related structure, the structure in Example 4 still provides a superior performance.

In Example 4, however, with the values of (dp+dn+2 di)=0.2 μm and d'=dp=0.1 μm being fixed, when the region width dn is taken as dn=0.0086 μm, and the impurity concentration $n_2$ is taken as $n_2$=d'·Nd/dn=$5\times10^{18}$cm$^{-3}$, the conditions of the n-type region 2 becomes similar to those in Example 2. As a result, the on-resistance RonA, with an additional increase in on-resistance by the amount corresponding to reduction in stripe density, becomes 1.32 mΩcm$^2$ (for an electron current flowing with a current density of 50 A/cm$^2$). This results in almost no change in performance in comparison with the on-resistance value RonA of 1.33 mΩcm$^2$ (for an electric current flowing with a current density of 100 A/cm$^2$) shown in FIG. 12 at the region width of dn=dp=0.1 μm in the related structure. In the comparison at a current density of 100 A/cm$^2$, the performance becomes inferior to that of the related structure. Therefore, a decrease in stripe density, caused by enlarging the periodic length (dp+dn+2 di) as the width of the unit of the superjunction structure, requires that the impurity concentration $n_2$ in the n-type region be taken higher by further thinning the width dn of the n-type region 2 to further improve the performance for one stripe.

In Example 4, with the periodic length further enlarged as (dp+dn+2 di)=0.5 μm, with d'=dp=0.25 μm, the value of Nd becomes Nd=$1.5\times10^{17}$cm$^{-3}$. With the impurity concentration $n_2$ in the n-type region 2 aimed to be $n_2$=d'·Nd/dn=$1\times10^{19}$cm$^{-3}$, the width dn becomes dn=0.00375 μm. At this time, the on-resistance RonA, with an additional increase in on-resistance by an amount corresponding to reduction in stripe density, becomes 1.75 mΩcm$^2$ (for an electron current flowing with a current density of 20 A/cm$^2$). Thus, the on-resistance RonA, even though evaluated with a current density of 20 A/cm$^2$, does not become larger than 2 mΩcm$^2$ and is a little below the value of approximately 2 mΩcm$^2$ as the performance value of the related structure.

Figure 5:
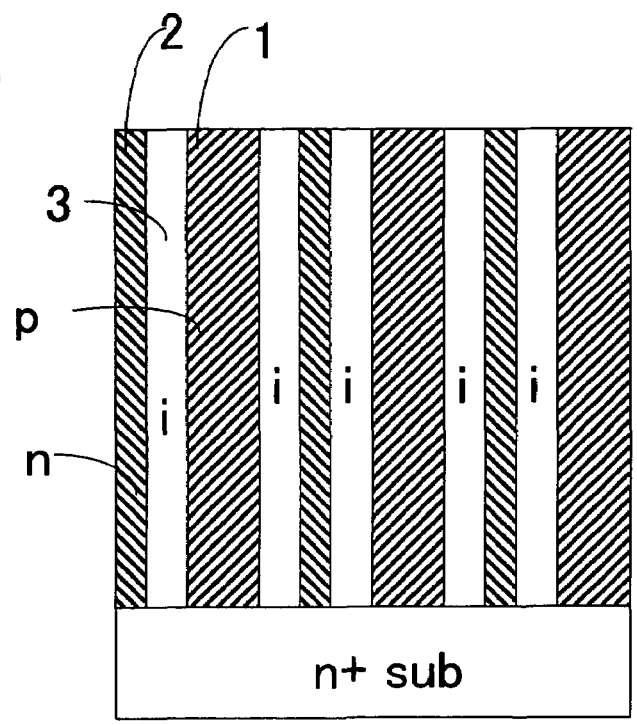
FIG. 5 schematically illustrates a cross section of a principal part of another embodiment of the superjunction structure according to the invention.

In Example 4, with charges in the n-type region and the p-type region being in balance with each other as the charges in the superjunction, there is no necessity for dn and dp to be equal to each other. As in the Example 4, when the superjunction structure is used for a unipolar device of an n-type conduction, by thinning only the width dn of the n-type region to increase an impurity concentration therein as shown in a cross sectional view of the superjunction structure in FIG. 5, the effect of reducing the on-resistance can be obtained.

Figure 6:
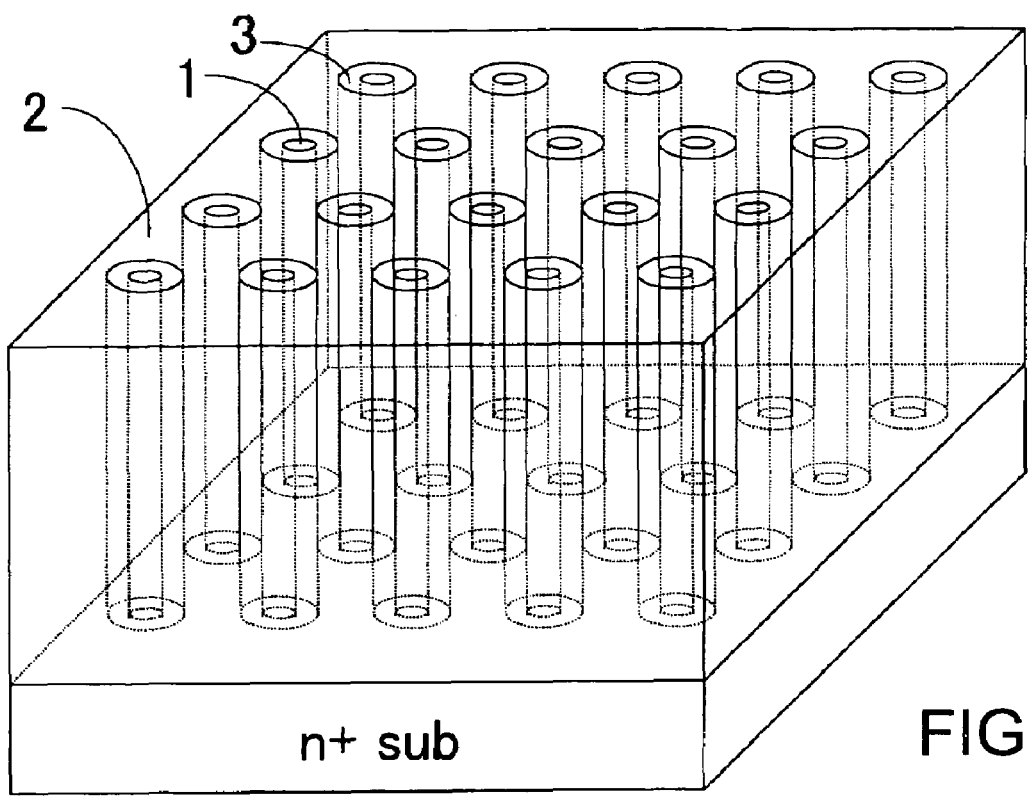
FIG. 6 is a perspective view schematically illustrating yet another superjunction structure according to the invention, having a column structure.
Figure 7:
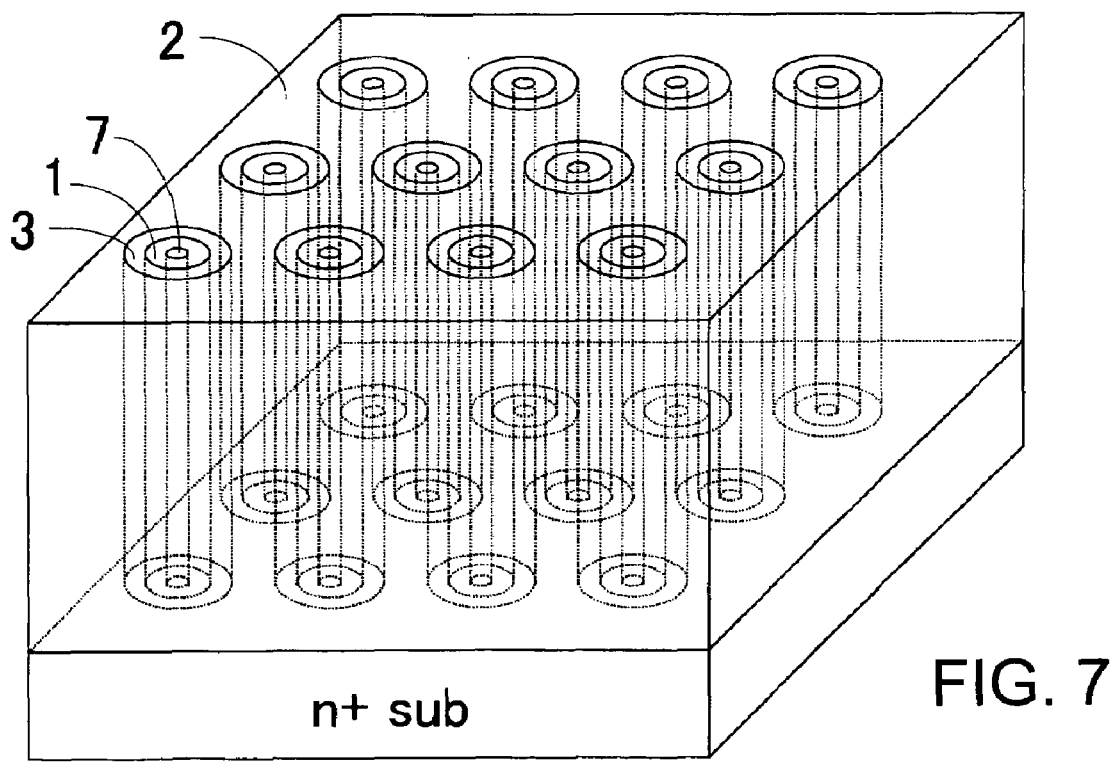
FIG. 7 is a perspective view schematically illustrating yet another superjunction structure according to the invention similar to the embodiment of FIG. 6.
Figure 8:
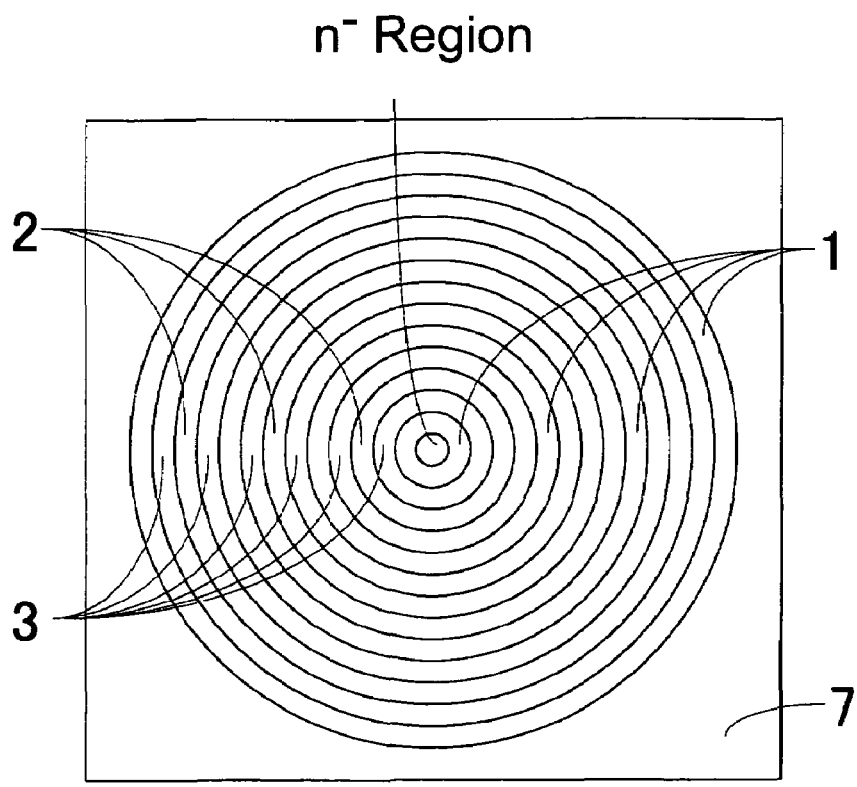
FIG. 8 schematically illustrates a cross-sectional pattern of yet another superjunction structure according to the invention similar to the embodiment of FIG. 6.

Note that a vertical superjunction structure according to the invention is not limited to the stripe form. With charges in the p-type region and the p-type region simply in balance with each other, the vertical superjunction structure can include a column or pillar form having a cross-sectional pattern of concentric circles with a plurality of ring-like regions as shown in FIG. 6, 7, or 8 ( FIG. 8 has a configuration similarly as disclosed in JP-A-2003-124465). In these embodiments, between the n-type region 2 and each p-type region 1, the first intrinsic semiconductor region 3 is provided, providing a bypass for the conduction carriers.

Figure 9:
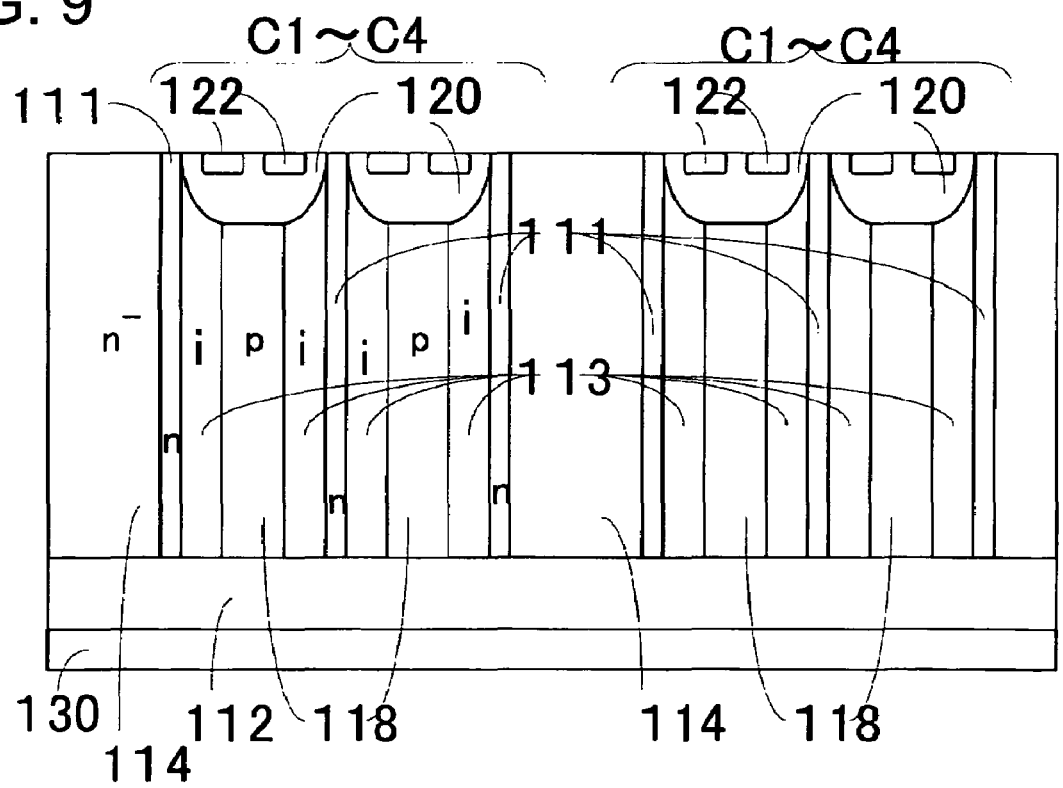
FIG. 9 schematically illustrates a cross section of a vertical MOSFET with the superjunction structure according to the invention.

FIG. 9 illustrates another embodiment according to the invention, namely a power MOSFET type semiconductor device having a superjunction structure having the collar or pillar form. This embodiment is similar to the structure disclosed in JP-A-2004-342660, but incorporates the intrinsic semiconductor region 113 to achieve the results close to Example 4. The power MOSFET type semiconductor device according to this embodiment has a plurality of cells, each including a structure formed on an n$^+$-type semiconductor substrate 112 in the direction perpendicular to the principal surface thereof with an intrinsic semiconductor region 113 positioned between an n$^+$-type pillar layer 111 and a p-type pillar layer 118. The pillar layers are separated by n$^-$-type interlayers 114 into a plurality of cells. On the p-type pillar layer 118, a p$^+$-type base region 120 is formed, on the surface of which an n$^+$-type source region 122 is formed.

On the principal surface of the substrate 112, including the above superjunction structure, a gate electrode (not illustrated) can be formed over an insulator layer (not illustrated). The gate electrode is formed so as to spread over the n$^+$-type pillar layer 111 from the source region 122. Moreover, over the source region 122 and the p$^+$-type base region 120, a source electrode can be connected. On the bottom side of the n$^+$-type semiconductor substrate 112, a drain electrode 130 is formed. When a specified gate voltage applied to the gate electrode, a channel is formed near the surface of the p$^+$-type base region 120 directly below the gate electrode to provide conductivity between the n$^+$-type source region 122 and the n$^+$-type pillar layer 111 and turn on the region between the source electrode and the drain electrode 130. Namely, current paths for each MOSFET are formed in each n$^+$-type pillar layer 111 and each intrinsic semiconductor regions 113 functioning as a bypass region of the n$^+$-type pillar layer 111. By increasing the impurity concentration in the n$^+$-type pillar layer 111, the on-resistance (RonA) can be reduced.

In the Embodiment of FIG. 9, four cells C1-C4 are formed so as to be adjacent to one another. A plurality of groups each made up of the four cells C1-C4 are separated from one another by the n$^-$-type interlayers 114. By thus forming the four cells C1 to C4 so as to be adjacent to one another with the intrinsic semiconductor regions 113 formed together, even when the density of forming the cells are considerably increased beyond the forming limit, the on-resistance RonA can be reduced. By providing the intrinsic semiconductor region or layer 113, it becomes possible to considerably decrease the width of the n$^+$-type pillar layers 111 than the width of the related structure.

Specifically, in the related art, a pillar structure was formed by stacking the pillar structure little by little by repeatedly carrying out ion implantation and epitaxial growth and finally carrying out long time activation treatment at a high temperature. Therefore, it was difficult to reduce the width of the pillar down to 10 µm or less. In the embodiment of FIG. 9, however, the pillar layers 111, 113 and 118 can be formed by epitaxial growth. As a result, it becomes considerably easy to reduce the width of the n$^+$-type pillar layer 111 down to 10 µm or less. Furthermore, it is also possible to reduce the width down to 1 µm or less. Namely, it becomes possible to form the n$^+$-type pillar layer 111, which provide the current path, having an impurity concentration considerably higher than that of the related structure. As a result, it becomes possible to increase the channel density to largely decrease the on-resistance RonA. Moreover, the breakdown voltage of the element can be enhanced by providing the n$^-$-type interlayer 114 at the end of the element to terminate the superjunction structure and reducing the impurity concentration in the interlayer 114 regardless of the impurity concentration in the cell.

Still referring to FIG. 9, when the stripes in the superjunction structure are parallel with the stripes in the MOSFET structure in a top surface region, the periodic length of the stripe in the superjunction structure is determined by the periodic length of the stripes in the MOSFET. Even in this case, when the preferable conditions described herein are satisfied, the desired results can be obtained. According to the invention, however, the desired results are better achievable for the considerably miniaturized periodic length of the stripe in the superjunction structure. Therefore, it is more desirable to provide a superjunction structure having the stripes orthogonal or approximately orthogonal to the stripes in the MOSFET structure in the top surface region so that the periodic length in the stripe of the superjunction structure is not determined by the periodic length of the stripe in the MOSFET structure. A typical structure of such a MOSFET is shown in FIGS. 10A and 10B.

Figure 10A:
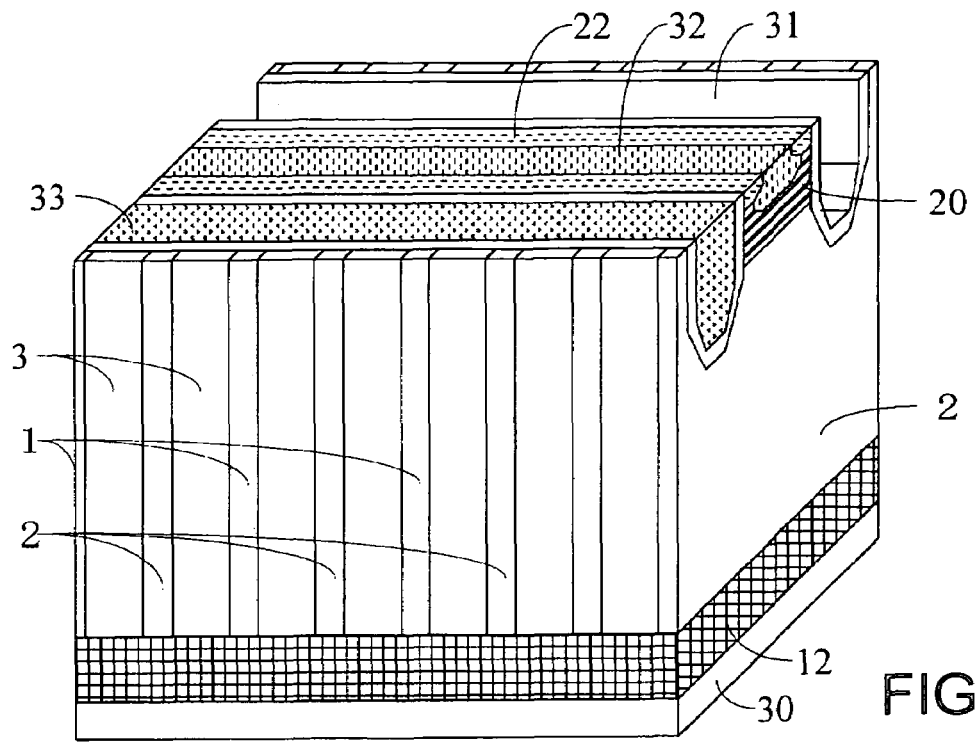
FIG. 10A is a perspective view schematically illustrating a principal part of a trench-gated vertical MOSFET with the superjunction structure according to the invention.
Figure 10B:
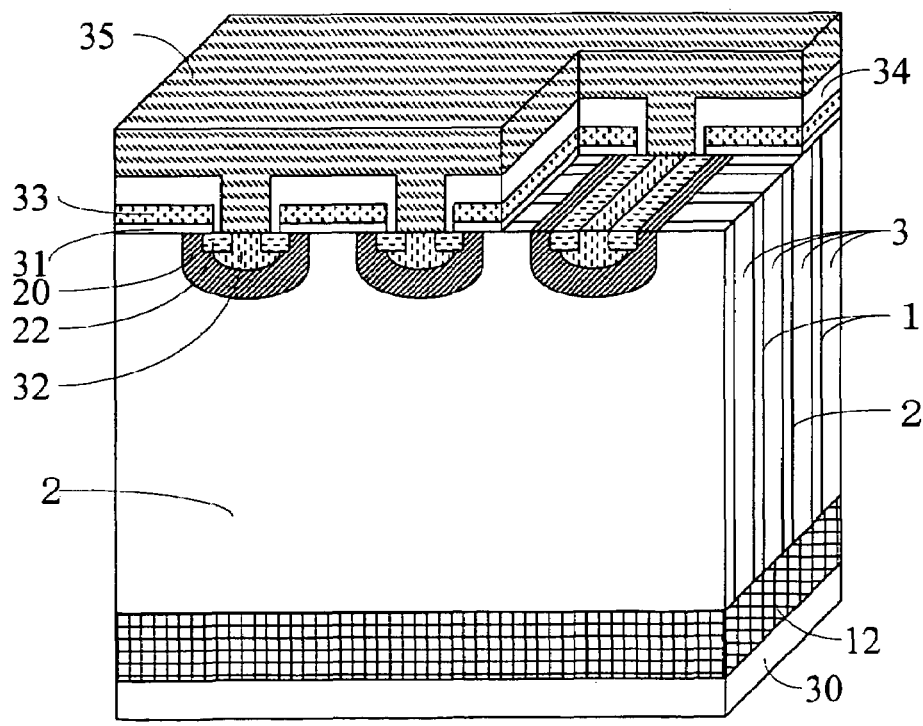
FIG. 10B is a perspective view schematically illustrating a principal part of a flat gate vertical MOSFET with the superjunction structure according to the invention.

FIGS. 10A and 10B illustrate principal parts of ordinary trench-gated and flat gated vertical MOSFETs incorporating the superjunction structure according to the invention. In FIG. 10B, the same reference numerals as those in FIG. 10A denotes parts having the same functions as the parts shown in FIG. 10A. As shown in FIG. 10A, on an n-type semiconductor substrate 12 of silicon with a high impurity concentration, pluralities of n-type regions 2, p-type regions 1, and intrinsic semiconductor regions 3 of the superjunction structure are formed as constituents of a repetitive structure of a unit, which is perpendicular to the principal surface of a substrate 12. On the bottom surface side of the n-type semiconductor substrate 12, a drain electrode 30 is provided. The top surface side of the superjunction structure has a trench 10 and a gate insulator film 31 provided along the inner face of the trench 10. The trench 10 is filled with a gate electrode 33 to form a trench gate. The gate electrode 33 can be polysilicon doped with phosphorus, for example. The linear surface pattern of the trench 10 can be formed as a pattern orthogonally intersecting the linear patterns of the unit, namely the p-type region 1, the n-type region 2, and the intrinsic semiconductor region 3.

On the surface of the superjunction structure, between the trench gates, a p-type well 20 with a high impurity concentration, an n$^+$-type source region 22 with a high impurity concentration formed in the p-type well 20 and a p$^+$-type region 32 with a high impurity concentration are provided. Moreover, a source electrode 35 in contact with the n$^+$-type source region 22 and the p$^+$-type region 32, but not in contact with the gate electrode 33 is provided similarly as shown in FIG. 10B. The gate electrode 33 and the source electrode 35 are insulated from each other with an interlayer insulator film 34 similarly as shown in FIG. 10B. The flat gate vertical MOSFET shown in FIG. 10B has a similar arrangement as the trench-gated vertical MOSFET shown in FIG. 10A, merely substituting the trench gate with the flat gate.

Figure 16:
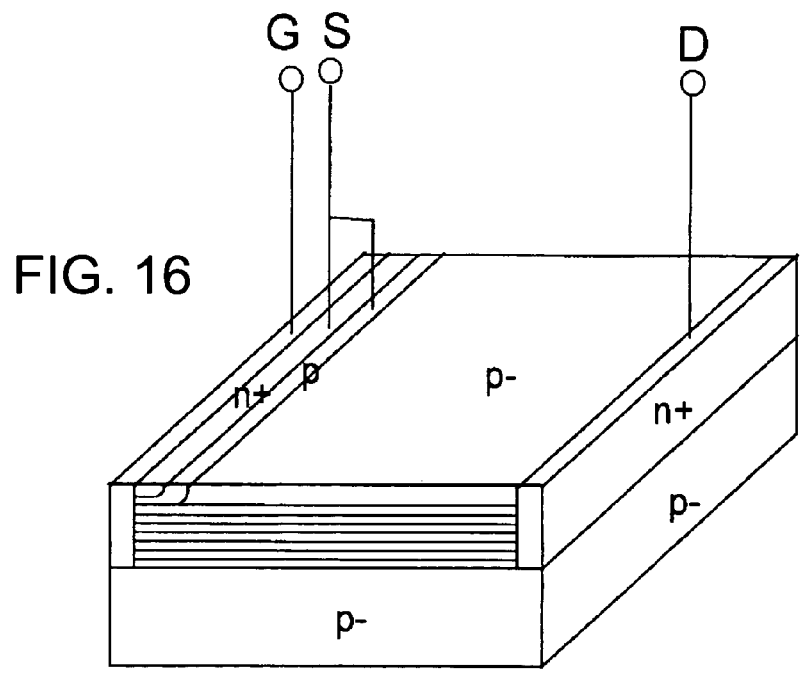
FIG. 16 is a perspective view schematically illustrating a related trench-gated lateral superjunction MOSFET.

The superjunction structure according to the invention is not limited to a vertical-type structure. For example, referring to FIG. 16, which is similar to the stacked structure shown in FIG. 1(a) of Fujihira's paper, the superjunction structure can be stacked. In this case, the manufacturing method thereof is the same as that for the stacked superlattice. Thus, ordinary technologies for manufacturing such devices as a HEMT, a semiconductor laser, and a stacked device with SiGe group can be used without modification.

When silicon is used as a semiconductor material for the structures, antimony is desirably for the n-type impurity. Phosphorus, due to its large diffusion constant in solid, makes it difficult to keep impurity atoms confined in a fine region with a high concentration. As to the p-type impurity, however, only boron can be used.

Figure 13:
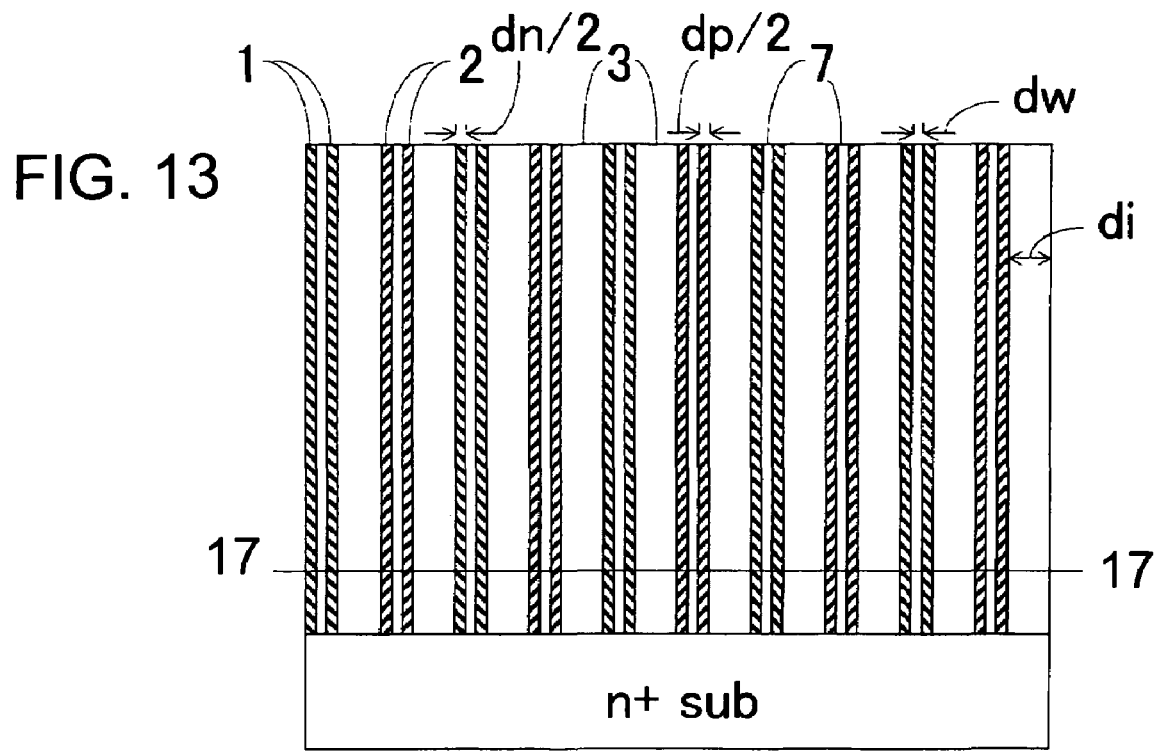
FIG. 13 schematically illustrates a cross section of a principal part of yet another superjunction structure according to the invention.

In Example 5, the superjunction structure has vertical stripe-like regions with an assumed breakdown voltage of 600 V, as illustrated in FIG. 13. With the width of the unit taken as (dp+2×di+dn+2×dw)=0.1 μm, the total width dn of two layers of the n-type region 2 and the total width dp of two layers of the p-type region 1 are taken as dp=dn=0.02 μm, the width di of the first intrinsic region 3 is taken as di=0.024 μm, and the width dw of the second intrinsic semiconductor region 7 is taken as dw=0.006 μm=6 nm. The de Broglie wavelength of an electron in silicon is approximately 7 nm at room temperature. In Example 1 (FIG. 1B corresponding to the embodiment of FIG. 13 without the second intrinsic semiconductor region 7), dw=0 and di=0.03 μm by which the calculated value of the on-resistance RonA by the device simulation was 0.86 mΩcm$^2$ (for an electron current flowing with a current density of 100 A/cm$^2$). In Example 5, however, by only inserting the second intrinsic semiconductor region 7 by the width dw of only dw=6 nm, the calculated value of the on-resistance RonA by the device simulation was significantly to 0.40 mΩcm$^2$ (for an electron current flowing with a current density of 100 A/cm$^2$).

Example 6 is similar to Example 5, except that the widths dp, dn and di are taken as dp=dn=0.01 μm and di=0.034 μm. In Example 2 (FIG. 1B corresponding to the embodiment of FIG. 13 without the second intrinsic semiconductor region 7), dw=0 and di=0.04 μm, by which the calculated value of the on-resistance RonA by the device simulation was 0.66 mΩcm$^2$ (for an electron current flowing with a current density of 100 A/cm$^2$). In Example 6, however, by only inserting the second intrinsic semiconductor region 7 by the width dw of only dw=6 nm like in Example 5, the calculated value of the on-resistance RonA by the device simulation was also improved to 0.40 mΩcm$^2$ (for an electron current flowing with a current density of 100 A/cm$^2$).

Example 7 is similar to Examples 5 and 6, except that the widths dp, dn, and di are taken as dp=dn=0.005 μm=5 nm and di=0.039 μm, and the impurity concentration $p_1$ in the p-type region 1 is given as $p_1$=d'·Nd/dp=1×10$^{19}$cm$^{-3}$ and the impurity concentration $n_2$ in the n-type region 2 is given as $n_2 \leqq$d'·Nd/dn=1×10$^{19}$cm$^{-3}$. A study of electron mobility revealed that the mobility is below 100 cm$^2$/Vs for the impurity concentration of 1×10$^{19}$cm$^{-3}$, which is more than one order of magnitude less compared with 1500 cm$^2$/Vs of the mobility in non-doped silicon.

In Example 3 (FIG. 1B corresponding to the embodiment of FIG. 13 without the second intrinsic semiconductor region 7), dw=0 and di=0.045 μm, by which the calculated value of the on-resistance RonA by the device simulation was 0.35 mΩcm$^2$ (for an electron current flowing with a current density of 100 A/cm$^2$). In Example 7, however, by only inserting the second intrinsic semiconductor region 7 by the width dw of only dw=6 nm like in Example 5, the calculated value of the on-resistance RonA by the device simulation was again improved to 0.18 mΩcm$^2$ (for an electron current flowing with a current density of 100 A/cm$^2$).

In Example 7, the values of electron mobility in the n-type region 2 and the second intrinsic semiconductor region 7 positioned between the two layers of the n-type regions 2 are 95 cm$^2$/Vs and 1500 cm$^2$/Vs, respectively. Moreover, the values of hole mobility in the p-type region 1 and the second intrinsic semiconductor region 7 positioned between the two layers of the p-type regions 1 are 70 cm$^2$/Vs and 470 cm$^2$/Vs, respectively. From this, it is known that the carrier mobility in each of the n-type region 2 and the p-type region 1 is one-half or below the carrier mobility in the second intrinsic semiconductor region 7.

Figure 4:
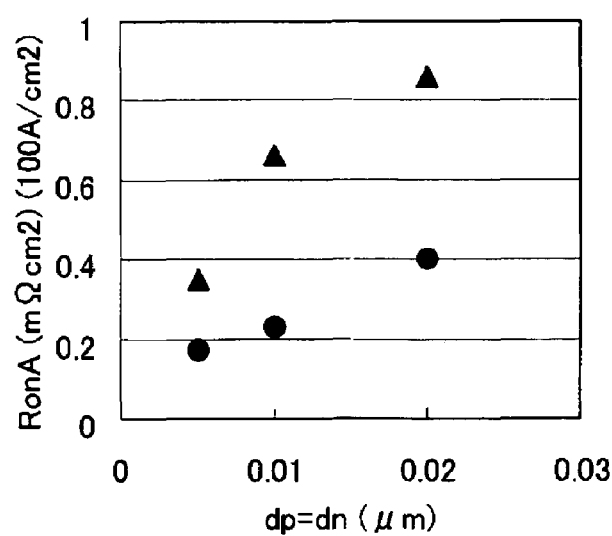
FIG. 4 is a characteristic diagram showing the relationship between the on-resistance and the region width of the superjunction structure embodiment of FIG. 13, with plots taken from Examples 5, 6, and 7 in comparison with the plots shown in FIG. 3.

The calculated values of the on-resistance RonA in the superjunction structures according to Examples 5-7, each provided with the second intrinsic semiconductor region 7, are shown in FIG. 4 in relation to the region width as the total widths of the two layers of the n-type region or the p-type region. For convenience of comparison, the calculated values of RonA of Examples 1 to 3 (without the second intrinsic semiconductor region) are also plotted. The comparison of the calculate values of RonA clearly reveals the benefit of including the second intrinsic semiconductor region. Even a value of RonA that could not be reached until the width dn of the n-type region and the width dp of the p-type region were taken as dn=dp=0.005 μm=5 nm in Example 3, can be achieved at a width of dn=dp=0.02 μm in Examples 5-7. With further finely provided region widths (dn=dp=0.01 and 0.005 μm), the on-resistance can achieve below 0.2 mΩcm$^2$ (for an electron current flowing with a current density of 100 A/cm$^2$).

The discussion presented in the foregoing is based on classical electron conduction theory. According to the concept of the theory, with conducting electrons treated as small particles, electric conduction is explained as follows. Namely, the particles, while being accelerated under an electric field, are scattered by ionized impurity atoms, lattice vibration and lattice defects, which results in presence of an equilibrium velocity in the traveling electrons. The equilibrium velocity is the drift velocity, which is divided by an electric field strength to be given as carrier mobility. Until the carrier moving velocity reaches the saturation drift velocity, the drift velocity and the electric field strength are in a proportional relation with the carrier mobility taken as a constant of proportion.

Such a theory is a rough approximation when observing one atom and one electron. Nevertheless, the theory can be applied in treating electric conduction in semiconductors and metals without a problem. However, when the size of the superjunction structure in the direction perpendicular to the drift direction of carriers is miniaturized down to a size in nanometers order, it is predicted that quantum-mechanical properties of conduction electrons and conduction holes will appear. Actually, the appearance of such a quantum-mechanical phenomenon has been ascertained by previous studies on a surface quantization phenomenon at an interface of a MOS structure and studies on formation of two-dimensional electron gas in a HEMT carried out thereafter.

Figure 17:
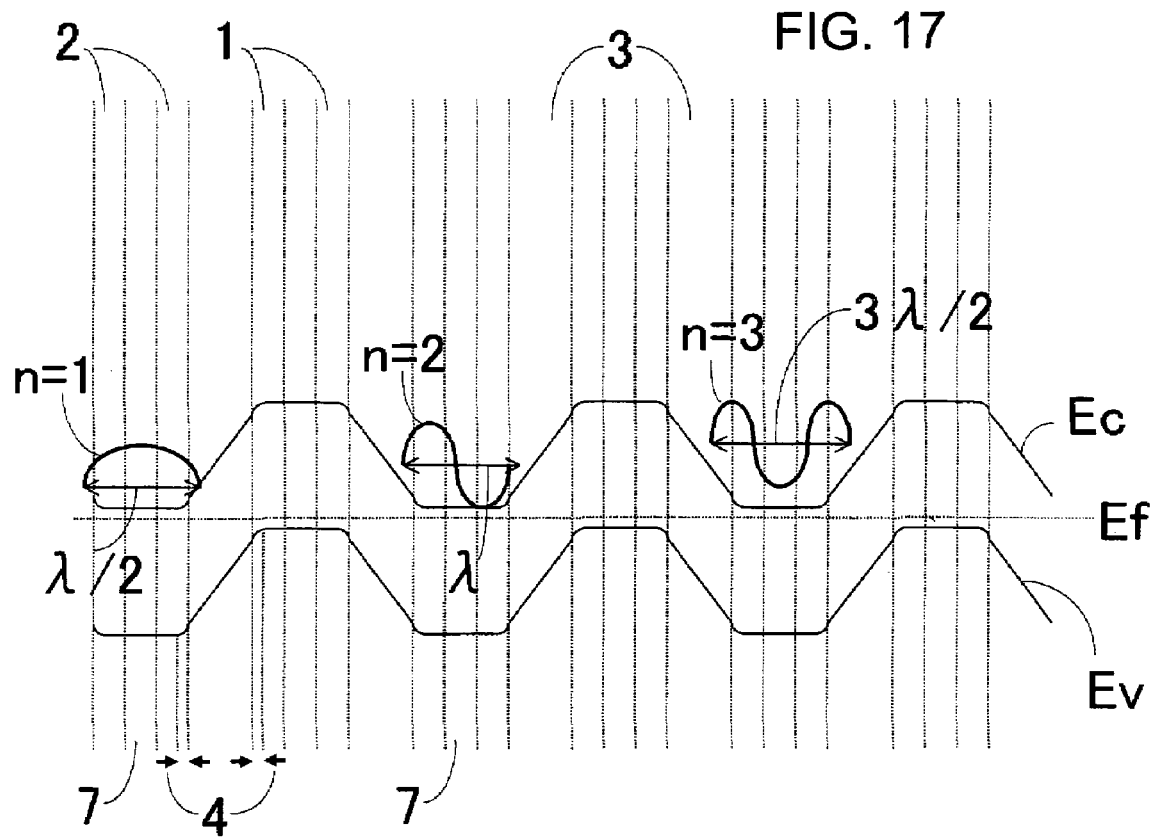
FIG. 17 schematically illustrates an energy band structure with the wave functions of electrons in the superjunction structure taken along line 17-17 of FIG. 13.

Observation of the band structure shown in FIG. 17, which schematically illustrates an energy band structure together with wave functions of electrons in the superjunction structure taken along 17-17 of FIG. 13, for example, allows a region of a trough in energy level into which conduction electrons or conduction holes fall down to be also considered as a pseudo quantum well into which those conduction electrons or conduction holes are confined by a built-in potential of 700 meV.

For example, in the structure of Example 3, with the width dw+dn regarded as dw+dn ≈10 nm, a quantum well is considered with the width L of the well given as L=10 nm and a confinement potential given as infinite. Then, as a rough estimation, quantizing energy of a conduction electron is given as follows:

$$En = h_b^2 \times (n \times \pi/L)^2/(2 \times m^*) \ldots \quad (3),$$

where $h_b$ is a constant in which Planck constant is divided by $2 \times \pi$, L is the width of the quantum well, n is a quantum number taking integers from 1 in order, and $m^*$ is the effective mass of an electron.

In silicon, the bottom of the conduction band is around an X point in a reciprocal lattice space (thus, silicon is an indirect gap semiconductor unsuitable for a light emitting device), and an iso-energetic surface forms an ellipsoidal body of revolution to have strong anisotropy. Therefore, the electron effective mass $m^*$ ranges from 0.25 to 0.98 times the electron mass $m_o$ in vacuum. Here, for the severest estimation, the electron effective mass is taken as being 0.98 times the electron mass in vacuum. By substituting L by L=10 nm in Equation (3), the structure shown in FIG. 17 has calculated quantizing energy of approximately 4 meV for n=1, approximately 16 meV for n=2, approximately 36 meV for n=3, and approximately 64 meV for n=4. In consideration of the energy of approximately 26 meV at the room temperature of 300 k and an operation at a high temperature of the order of 400 K, it can be predicted that phonon scattering is relatively liable to occur from the lowest energy level of n =1 to the level of n=3. Therefore, it is considered that such strong quantum confinement, as being brought to the extent of being equivalent to the quantum confinement in the case of a HEMT, is hard to achieve in which two dimensional electron gas formed with electrons only in the lowest level of n=1 are confined. The reason for this is in the electron effective mass in silicon. For obtaining a strong quantum effect, the electron effective mass must be reduced by making use of the anisotropy, or the structure must be further scaled down.

However, although there is a limit due to the material of silicon, it is considered that in the structure scaled down to the extent of the structure shown in FIG. 13, quantization states with quantum numbers up to n=1 to 3 can be obtained. In FIG. 17, wave functions of electrons quantized in the lateral direction are schematically shown. Wave functions are those showing magnitudes of abundance probability of electrons. Of the wave functions, each of those with n=1 and n=3 shows that electrons have a large abundance probability in the second intrinsic semiconductor region 7. The second intrinsic semiconductor 7 has no impurity and is less susceptible to ionized impurity scattering. Thus, it can be expected that higher electron mobility can be obtained than predicted by classical electric conduction theory. Moreover, in the arrangement shown in FIG. 1B, the electrons, being two-dimensionally confined, are subjected to scattering in the vertical directions and in the direction perpendicular to the drawing with the scattering in the lateral direction being restricted. This is the same effect as that obtained by the two-dimensional electron gas in a HEMT. The wave function with n=2, however, has large abundance probability in the n-type region 2. Thus, electrons are susceptible to ionized impurity scattering in the region 2 to obtain mobility only with a value in the n-type region 2 according to classical electric conduction theory. Therefore, it is predicted that no benefit of high mobility possessed by electrons in the second intrinsic semiconductor region 7 can be obtained. However, even in the case of n=2, the effect of restricting electron scattering in the lateral direction is still left by the effect of two dimensional confinement of electrons. The whole current density corresponds to the sum of respective number densities of electrons providing conduction in quantum states of n=1 to 3. Of the states n=2 and n=3, electrons are prone to falling into the state of n=1 where energy is at the lowest level. Hence, conduction shared by electrons in the state of n=1 is considered to become dominant. Thus, there is a possibility that the current density exceeds the density predicted from the classical theory.

Figure 18:
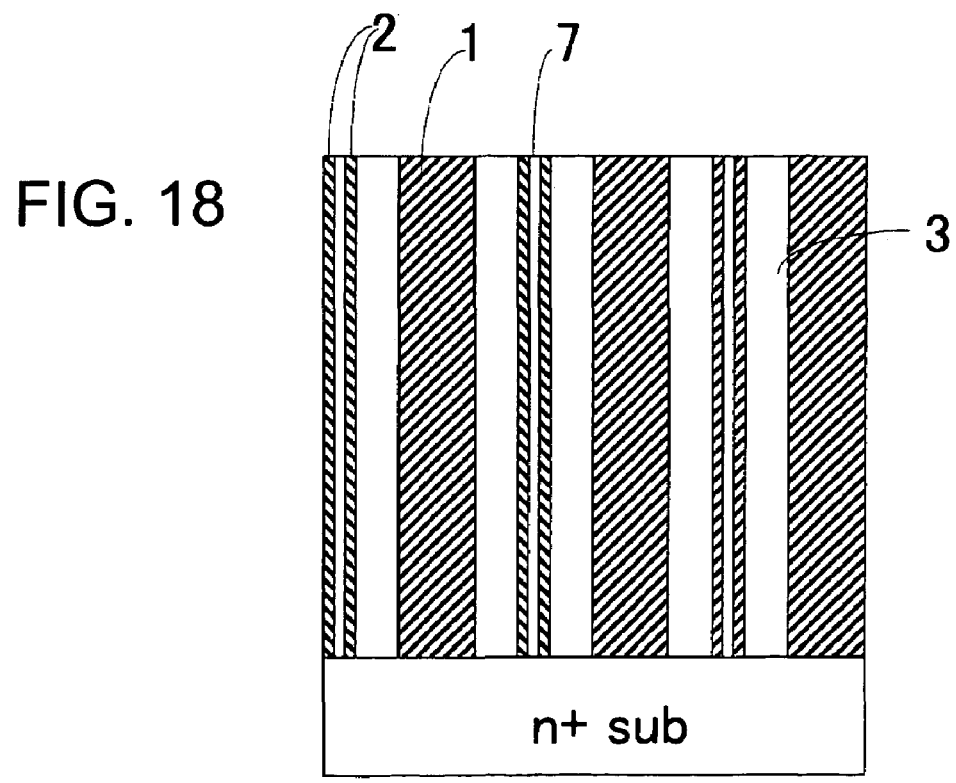
FIG. 18 schematically illustrates a cross section of a principal part of yet another superjunction structure according to the invention.

In Examples 1-7, the width dn of the n-type region 2 and the width dp of the p-type region 1 are taken as dn=dp. Since charges in the n-type region 2 and the p-type region 1 are in balance with each other as those in the superjunction, there is no need for dn and dp to be equal to each other. For example, when the superjunction structure is used for a unipolar device of an n-type conduction, with only the width dn of the n-type region 2 made thinner, the impurity concentration therein increased, and the second intrinsic semiconductor region 7 inserted in the center of the n-type region 2 as shown in FIG. 18, desired results still can be obtained.

As previously explained, a vertical superjunction structure is not limited to the stripe form. With charges in the n-type region and the p-type region simply in balance with each other, a plane pattern as shown in FIG. 7 can be taken, for example. The second intrinsic semiconductor region 7, while it was a pseudo quantum well in the embodiment of FIG. 13, can have a pseudo quantum wire structure as another embodiment. In a quantum wire, further increase in electron mobility is expected than in a quantum well (H. Sakaki, "Scattering Suppression and High-Mobility Effect of Size-Quantized Electrons in Ultrafine Semiconductor Wire Structures", Japanese Journal of Applied Physics, Vol. 19, No. 12, December, 1980 pp. L735-L738). However, formation of one-dimensional electron gas in a quantum wire and accompanied increase in electron mobility are only theoretically predicted without experimental demonstration. This is in contrast to two-dimensional electron gas that has been experimentally studied well.

For the studies on conduction in a one-dimensional wire of a very short length, studies on a quantum point contact are well carried out theoretically as well as experimentally. Regarding the quantum point contact, however, current to voltage characteristics thereof are observed in many cases by generally passing electrons in a one-dimensional wire with a length shorter than the mean free path of electrons, in which conduction electrons move between electrodes without being scattered even once. Therefore, no proof is given to the prediction in the Sakaki's paper that scattering is inhibited by the one-dimensional wire. Experimental confirmation as to whether or not scattering of carriers is actually inhibited to increase carrier mobility in a one-dimensional wire sufficiently longer than the mean free path of carriers is considered to be one of important subjects in the field of semiconductor nanotechnology.

The superjunction structure is not limited to a vertical-type structure. For example, the lateral stacked structure shown in Fujihira's paper can be taken. In this case, the manufacturing method thereof is the same as that for the stacked superlattice. Thus, ordinary technologies for manufacturing such devices as a HEMT, a semiconductor laser and a stacked device with SiGe group can be used without modification.

Figure 20:
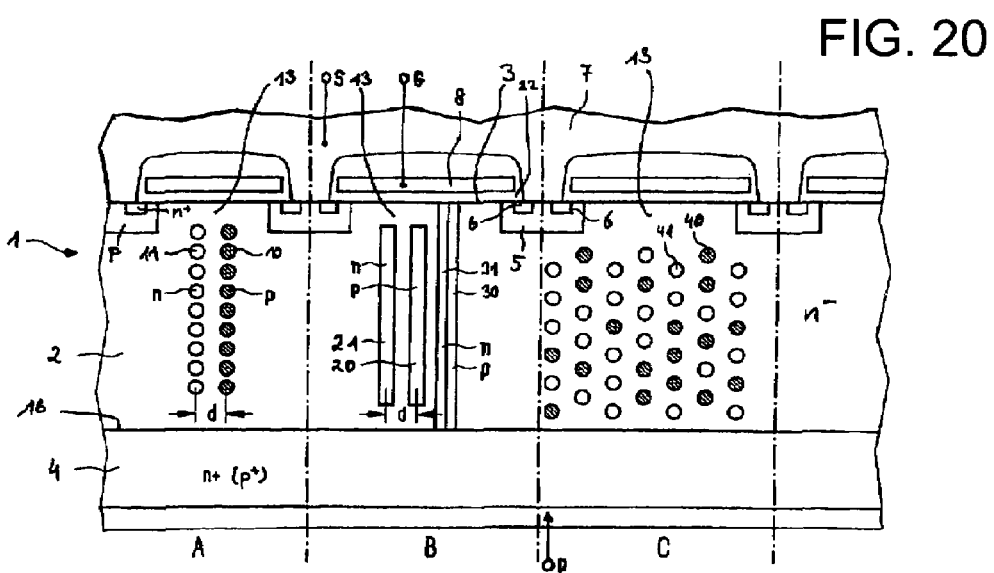
FIG. 20 schematically illustrates a cross section of the superjunction structure shown in FIG. 1 of JP-T-2000-504879.

Referring to FIG. 20, which illustrates an ne-type region 2 shown in FIG. 1 in JP-T-2000-504879 (attached to the present specification as FIG. 20), the n⁻-type region is considered to be similar to the intrinsic semiconductor region including also the n⁻-type region in the superjunction structure. The n⁻-type region 2 has a function of quickly determining electric potentials, being floating potentials, of p-type regions 10, 20, 30 and 40 and n-type regions 11, 21, 31 and 41. That is, at turning-off at which the device is switched from an on-state to an off-state, the p-type regions 10, 20, 30 and 40 and the n-type regions 11, 21, 31 and 41 are neither grounded nor connected to electrodes whose electric potentials are definite. Thus, in this sense, the electric potentials of the regions are of floating potentials which are so indefinite that some cases can be considered in which electric potentials violently drift to cause noise. Hence, when the n⁻-type region 2 is provided, a depletion layer is produced from the top surface side of the device to extend toward the bottom surface side. In this process, the electric potentials of the p-type regions 10, 20, 30 and 40 and the n-type regions 11, 21, 31 and 41, successively included in the depletion layer, do not become floating potentials but become definite potentials. Thus, the n⁻-type region 2 has no direct function of contributing to the on-resistance reduction, so that the n⁻-region 2 is apparently different from the intrinsic semiconductor region for contributing to the on-resistance reduction.

Figure 21:
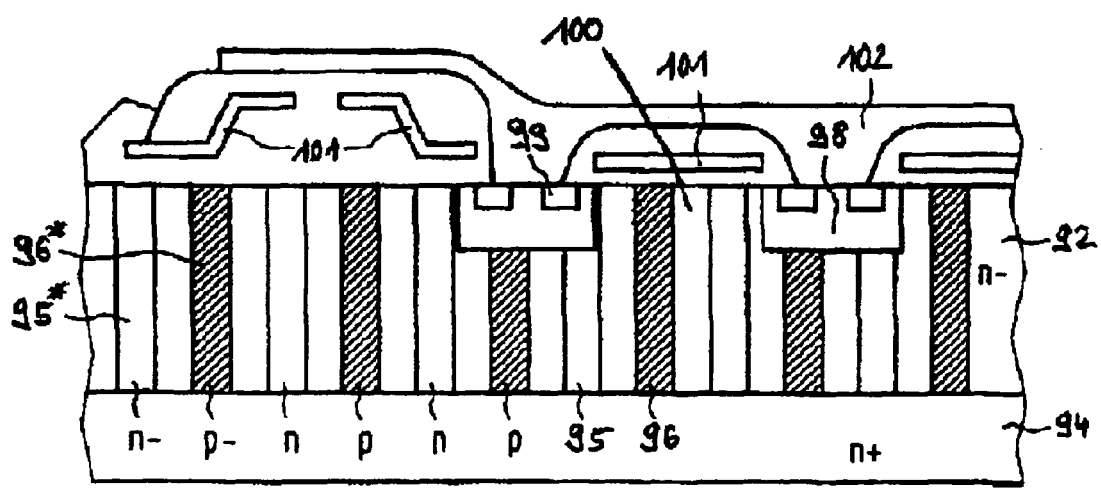
FIG. 21 schematically illustrates a cross section of the superjunction structure shown in FIG. 7d of JP-T-2000-504879.

FIG. 21 illustrates an arrangement shown in FIG. 7d of JP-T-2000-504879, which is also based on the same design concept as the arrangement shown in FIG. 20. Therefore, when the device with the arrangement shown in FIG. 21 is in the turned-on state, the main current path is provided as an n-type region 95 in an n-type conduction device and a p-type region 96 in a p-type conduction device. Moreover, according to the description in JP-T-2000-504879, light doping of only the n⁻-region denoted by reference numeral 95* at a peripheral region and a p-region similarly denoted by reference numeral 96* at the peripheral region is advantageous. The "light doping" means that the regions 95* and 96* are doped more lightly than the other regions denoted by reference numerals 95 or 96 as the main current paths. Furthermore, an n⁻-region 92 is a layer equivalent to an ordinary drift region and has a function of successively making electric potentials of the respective n-type regions 95 and p-type regions 96 definite from the top surface side toward the bottom surface side at turning-off. Thus, the n⁻-region 92 provides no function of directly contributing to the on-resistance reduction. Accordingly, the n⁻-region 92 functions differently from the intrinsic semiconductor region. Therefore, all of the n⁻-regions denoted by reference numerals 95*, 96* and 92 have different working effects from those of the intrinsic semiconductor region, including the n⁻-region or the p⁻-region.

In the device disclosed in JP-A-2004-342660, n⁻-regions 14 are provided among cells C1-C4 shown in FIG. 1 of JP-A-2004-342660. The n⁻-regions 14, however, are provided only from the view point that the n⁻-regions 14 are necessary for carrying out the manufacturing process shown in FIGS. 1-28 of JP-A-2004-342660. In the arrangement of the device disclosed in JP-A-2004-342660, for the lowest on-resistance, it is desirable for the units of the cells C1-C4 to be aligned without clearance, i.e., the width of the n⁻-regions 14, shown in FIG. 1 in JP-A-2004-342660, is zero. Therefore, the n⁻-regions are not effective for reducing the on-resistance, and provide a different function from the intrinsic semiconductor region.

Figure 2:
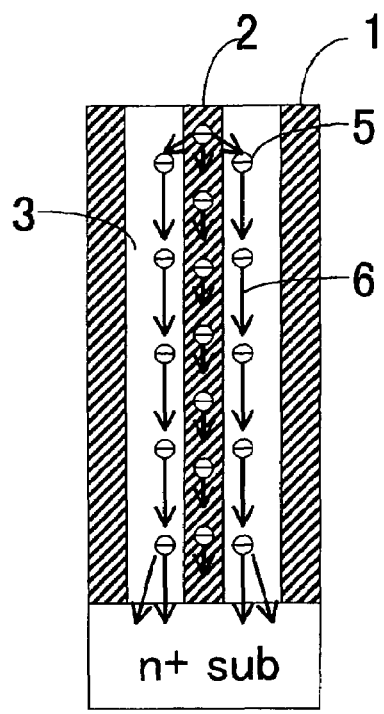
FIG. 2 schematically illustrates an enlarged cross section of the superjunction structure of FIG. 1A with simplified behavior of electrons passing therein.

According to the embodiment of FIG. 1A, with each fine region width kept the same as the fine region width (dp or dn) of the superjunction structure shown in FIG. 11A, each impurity doped region shown in FIG. 11A is confined to a finer region while the total amount of impurity is kept fixed, and the rest of the region is provided as an intrinsic semiconductor region (i region). Here, the region width shown in FIG. 1A being equal to the region width shown in FIG. 11A means that the width (dp+dn) shown in FIG. 11A is equal to the width (dp+dn+2 di) shown in FIG. 1A. The doped region in FIG. 11A being confined to a finer region in FIG. 1A with the total amount of impurity kept fixed means that an impurity concentration in the doped region in FIG. 1A becomes higher than that in the doped region shown in FIG. 11A. As a result, expansion of a depletion region in the doped region is confined and, at the same time, mobility of carriers is further decreased. In this state, the device is supposedly turned-on. For example, assume an n-conduction type unipolar device. Electrons as carriers performing major conduction are supplied from an n-type region 2 shown in FIG. 1A. For the convenience of explanation, an enlarged view of a section shown in FIG. 1A is shown in FIG. 2 with simplified behavior of electrons passing therein. The section includes the n-type region 2 at the center, the first intrinsic semiconductor regions 3 disposed on both sides of the n-type region 2, and the p-type regions 1 further in contact with both of the outer sides of the intrinsic semiconductor regions 3. In the n-type region 2 of FIG. 2, being made to have a high impurity concentration as explained above, the electron density is high, but carrier mobility is low. This causes electrons to bypass the n-type region 2 and flow easily in the first intrinsic semiconductor region 3 in which an electron density is low but the carrier mobility is high, which exerts a favorable effect of reducing the on-resistance. Furthermore, the first intrinsic semiconductor region 3 becoming to play a role of a major current path enables significant reduction in the on-resistance. In a state shown in FIG. 2, the electron density itself is the highest in the doped n-type region 2. However, mobility of an electron (may be interpreted as a drift velocity) schematically shown by the length of an arrow 6 is larger in the first intrinsic semiconductor region 3 than in the doped n-type region 2 by approximately one order of magnitude. Since the current density is a product of carrier density and drift velocity, then the desired effect of bypassing the doped n-type region 2 is produced. That is, by providing a carrier supplying region and a carrier transit region which are separated from each other, the on-resistance reduction becomes feasible.

Figure 11B:
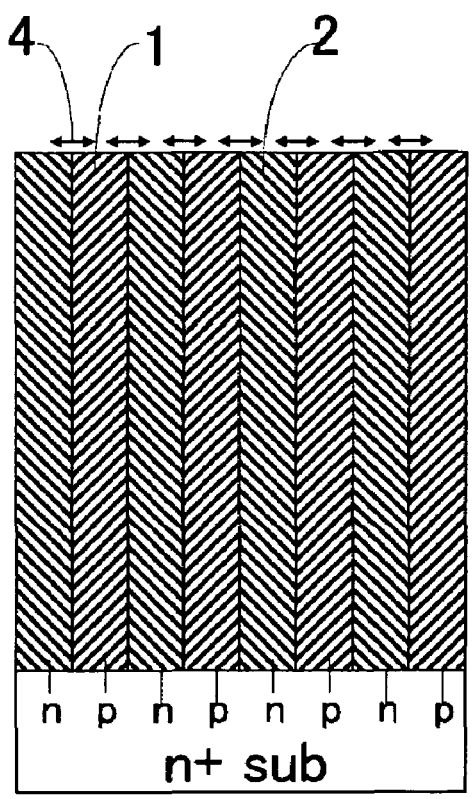
FIG. 11B schematically illustrates a cross section similar to FIG. 11, with narrower region widths.

As an extension of the related superjunction structure as shown in the above cross sectional view in FIG. 11A, the region widths dp and dn of the p-type region 1 and the n-type region 2, respectively, in the parallel p-n region are made narrower in FIG. 11B with the impurity concentration therein increased. As shown in FIG. 12, the characteristic diagram showing the relationship between the on-resistance and the region width, it was found that, when silicon crystal is used, the on-resistance reduction is gradually interrupted for the region widths made to become smaller than the region width of the order of dp=dn=0.5 μm and the phenomena of inversely increasing the on-resistance occurs for the region width at 0.05 μm.

The concept of separating the carrier supplying region and the carrier transit region according to the invention is not yet common in the field of power semiconductor devices, but the structure according to the concept has a similarity to that of a HEMT (High Electron Mobility Transistor) as a low capacity FET. A HEMT uses a heterojunction structure of compound semiconductors for abruptly varying band profiles to thereby separate a carrier supplying region and a carrier transit region. While, the device according to the invention, being intended to be used for power semiconductor devices, is made to have an arrangement in which no heterojunction structure is used, but the carrier supplying region and the carrier transit region are separated by making use of the difference between degrees of carrier mobility. While this arrangement enables realization of further reduction in on-resistance by making a current bypass a high impurity concentration region with low carrier mobility to flow in an intrinsic semiconductor region with high carrier mobility, it still poses problems.

Figure 1B:
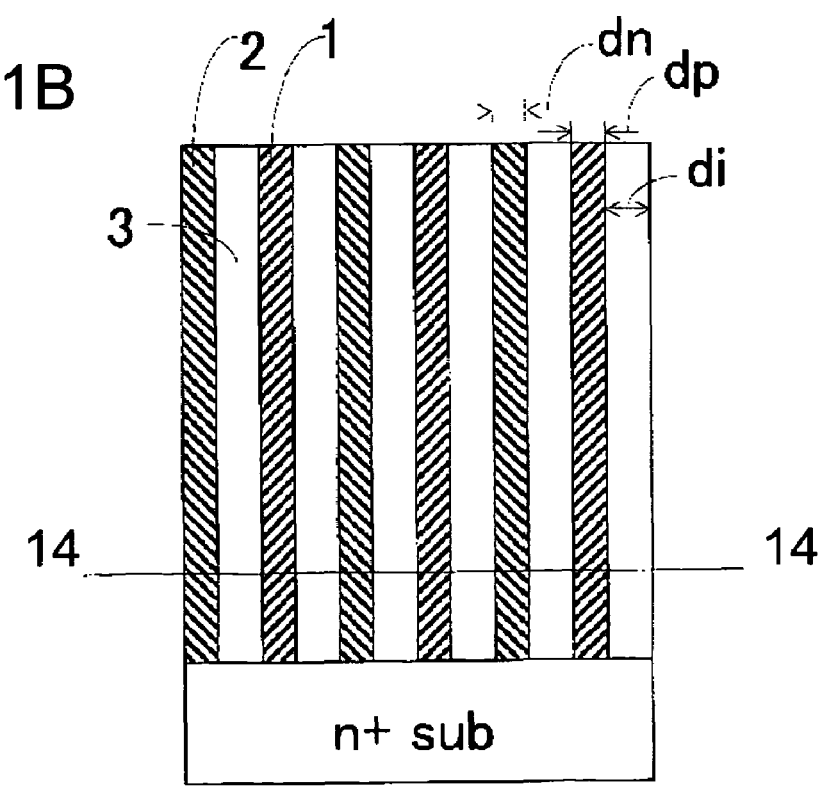
FIG. 1B is identical to FIG. 1A, with added references.
Figure 15A:
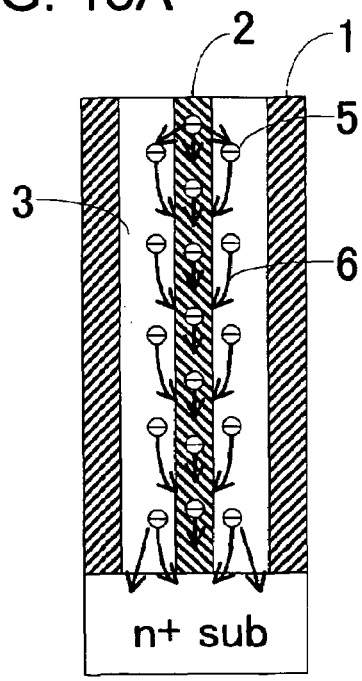
FIG. 15A schematically illustrates an enlarged cross section of the superjunction structure of FIG. 1A showing the behavior of electrons passing therein.
Figure 14:
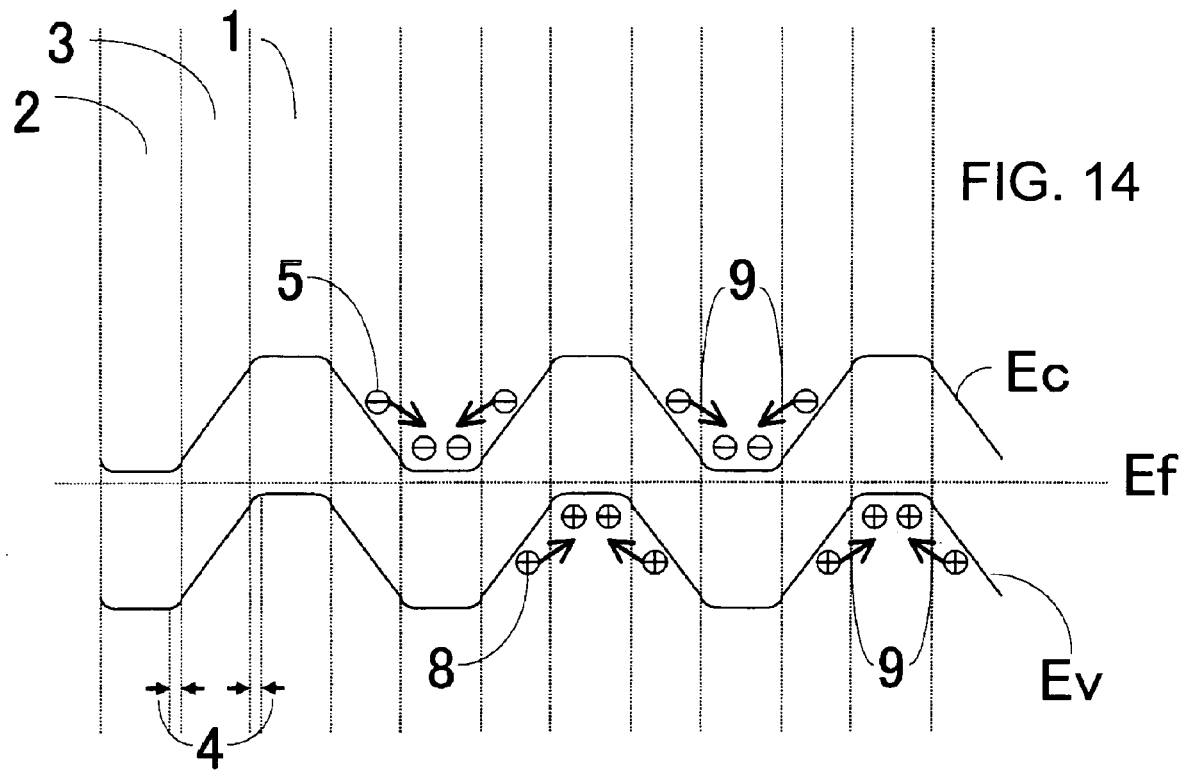
FIG. 14 schematically illustrates an energy band structure with the state of electrons and holes in the superjunction structure taken along lines 14-14 of FIG. 1B.

FIG. 14 schematically illustrates an energy band structure together with the state of electrons and holes taken along line 14-14 of FIG. 1B, which is the same cross sectional view as FIG. 1A. In FIG. 14, signs Ec and Ev designate the bottom of the conduction band and the top of the valence band, respectively. Sign Ef designates the Fermi level. Conduction electrons 5 bypassing the n-type region 2 to pass the first intrinsic semiconductor region 3 and conduction holes 8 bypassing the p-type region to pass the first intrinsic semiconductor region 3 are attracted by the electrostatic attractive forces 9 between the ionized impurities (this may be also considered that these carriers fall into a further lower energy level due to gradient of potential energy caused by the electrostatic attractive force) to be always pulled back to the n-type region 2 or the p-type region 1. Thus, a state of being susceptible to ionized impurity scattering likely remains (i.e., the above-described separation of the carrier supplying region and the carrier transit region is not so easy). In other words, in a unipolar device of n-type conduction, as is illustrated in FIG. 15A, which is similar to FIG. 2, although electron current flowing in the first intrinsic semiconductor region 3 is dominant because its carrier mobility is higher than that of the electron current flowing in the n-type region 2, conduction electrons 5 in actual behavior are sometimes pulled back from the region 3 to the region 2, where the conduction electrons 5 are subjected to ionized impurity scattering. Thus, it means that no full use has been made of the merit of higher carrier mobility in the first intrinsic semiconductor region 3.

Figure 19:
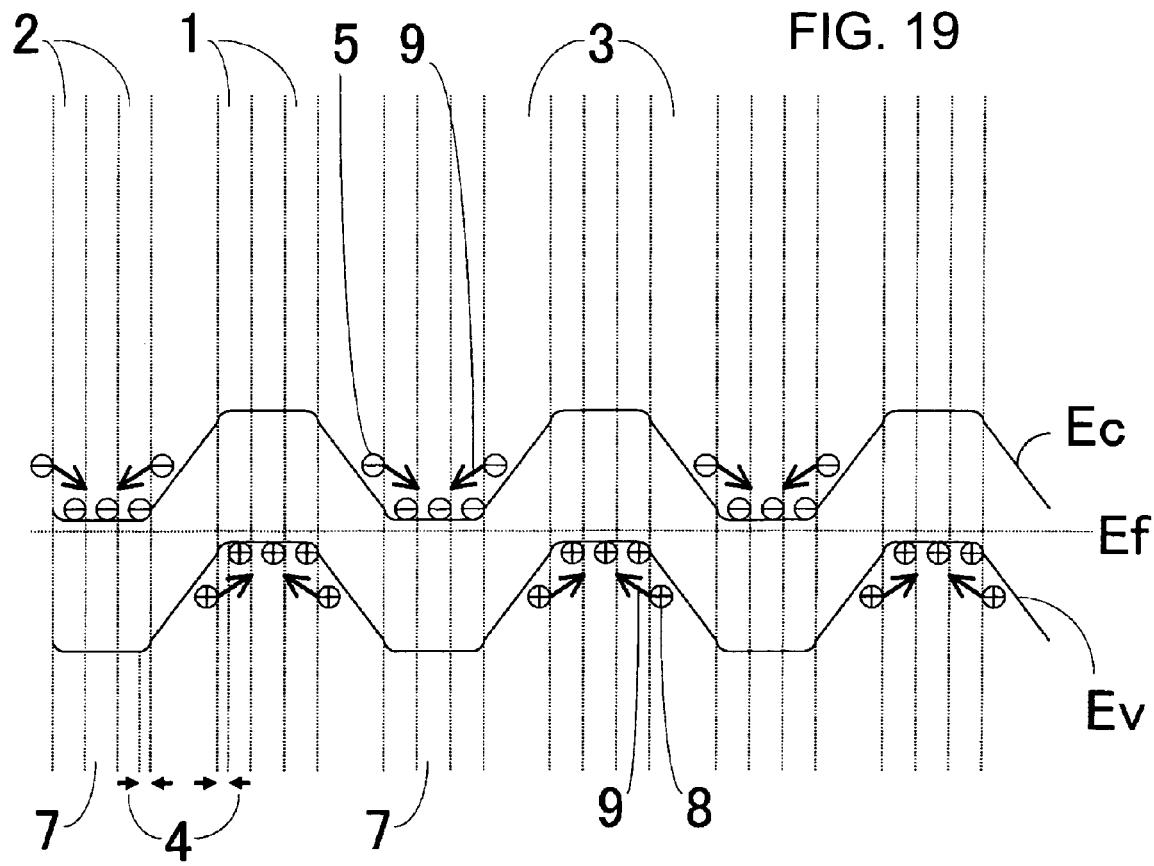
FIG. 19 schematically illustrates an energy band structure with the state of electrons and holes in the superjunction structure taken along line 17-17 of FIG. 13.

In comparison, the semiconductor superjunction device according to the present invention, in particular the embodiment of FIG. 13, the second intrinsic semiconductor region 7, which becomes a bypass, is provided in the central section of one or both of the n-type region 2 and the p-type region 1. FIG. 19 illustrates a view of an energy band structure together with the state of electrons and holes in the superjunction structure taken along line 19-19 of FIG. 13. In FIG. 19, conduction electrons 5 or conduction holes 8 flowing in the bypass (the second intrinsic semiconductor region) 7 receive electrostatic attractive forces equal to each other from the right and left sides. Thus, both forces cancel out each other (as a natural result, potential energy has no gradient) to allow the conduction electrons 5 or conduction holes 8 to move straight forward in the bypass 7. As a result, the problem shown in the FIG. 15A can be solved by providing a second intrinsic semiconductor region 7, namely problem where the conduction carriers are pulled back from the first bypass region (the first intrinsic semiconductor region) 3 to the n-type region 2 or the p-type region 1 and subjected to ionized impurity scattering there.

Figure 15B:
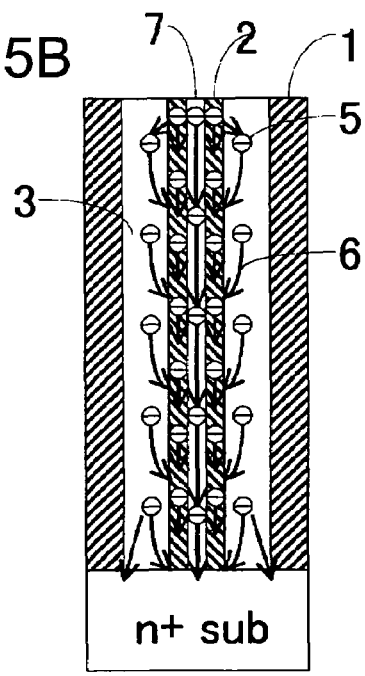
FIG. 15B schematically illustrates an enlarged cross section of the superjunction structure of FIG. 13 showing the behavior of electrons passing therein.

In FIG. 15B, electrons passing through the second intrinsic semiconductor region 7, having high mobility and good straightness due to cancellation of the electrostatic forces acting from both of the right and left sides, can further contribute to reducing the on-resistance. Since the position of the second intrinsic semiconductor region 7 corresponds to the position of the bottom of the potential energy shown in FIG. 19, electrons fall into the lowest energy level to result in a high electron density. Since the current density is determined by a product of an electron density and a drift velocity, it is desirable that both be large. At the same time, the electrons passing through the first intrinsic semiconductor region 3, though they are inferior to those in the second intrinsic semiconductor region 7 in both current density and drift velocity, still contribute to the on-resistance reduction. Therefore, the on-resistance is determined by the sum of the amount of the current flowing in the second intrinsic semiconductor region 7 and the amount of the current flowing in the first intrinsic semiconductor region 3.

According to the invention, the lower thickness limit can be eliminated to improve the tradeoff relationship.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-064376, filed on 08 Mar. 2005. The disclosure of the priority application, in its entirety, including the drawings, claims, and the specification thereof, is incorporated herein by reference.

What is claimed is:

1. A semiconductor superjunction device comprising:
   a semiconductor substrate;
   a drift region formed in the substrate; and
   a superjunction structure formed in the drift region,
   wherein the superjunction structure having alternately arranged n-type regions and p-type regions both layered parallel with the drift direction of carriers to allow current flow in an ON state and to deplete in an OFF state,
   wherein the superjunction structure further includes a first intrinsic semiconductor region between the n-type region and the p-type region, the first intrinsic semiconductor region, the n-type region, and the p-type region forming a unit, and a repetitive structure comprising a plurality of units that are repetitively arranged, and
   wherein the value of mobility of one of electrons in the n-type region or holes in the p-type region is equal to or less than half the value of mobility of corresponding one of electrons or holes in the first intrinsic semiconductor region.

2. The semiconductor superjunction device according to claim 1, further including a second intrinsic semiconductor region formed inside one of the n-type region or the p-type region forming the unit of the repetitive structure or between the n-type or p-type regions of adjacent units of the repetitive structure, wherein the value of mobility of one of electrons in the n-type region or holes in the p-type region is equal to or less than half the value of mobility of corresponding one of electrons or holes in one of the first intrinsic semiconductor region or the second intrinsic semiconductor region.

3. The semiconductor superjunction device according to claim 2, wherein the unit of the repetitive structure has a total width equal to or less than 0.5 µm.

4. The semiconductor superjunction device according to claim 3, wherein the width of the second intrinsic semiconductor region in the unit of the repetitive structure has, with de Broglie wavelength of a carrier drifting in the region taken as λ, a magnitude within the range of λ2 to 3λ, and the carriers form one-dimensional electron gas when the carriers are electrons and form one-dimensional hole gas when the carriers are holes.

5. The semiconductor superjunction device according to claim 2, wherein the width of the second intrinsic semiconductor region in the unit of the repetitive structure has, with de Broglie wavelength of a carrier drifting in the region taken as λ, a magnitude within the range of λ2 to 3λ, and the carriers form one-dimensional electron gas when the carriers are electrons and form one-dimensional hole gas when the carriers are holes.

6. The semiconductor superjunction device according to claim 2, wherein the substrate is composed of a silicon single crystal as a semiconductor material, at least one of the n-type region or the p-type region has an impurity concentration equal to $1 \times 10^{17} cm^{-3}$ or more, and one of the first intrinsic semiconductor region or the second intrinsic semiconductor region is composed of one of an n-type semiconductor or a p-type semiconductor having an impurity concentration equal to $1 \times 10^{16} cm^{-3}$ or less.

7. The semiconductor superjunction device according to claim 2, wherein when the superjunction structure is turned ON, at least one of a relation between a density $J_{n3}$ Of electron current flowing in at least one of the first or second intrinsic semiconductor region and a density $J_{n2}$ of electron current flowing in the n-type region expressed as $J_{n3} \leq J_{n2}$, or a relation between a density $J_{p3}$ of hole current flowing in at least one of the first or second intrinsic semiconductor region and a density $J_{p1}$ of a hole current flowing in the p-type region expressed as $J_{p3} \leq J_{p1}$, is satisfied.

8. The semiconductor superjunction device according to claim 2, wherein the mobility of carriers in at least one of the first or second intrinsic semiconductor region is equal to or more than 90% compared with the theoretical mobility of carriers in an intrinsic semiconductor region.

9. The semiconductor superjunction device according to claim 2, further including a MOSFET structure having source regions of one of a p-type or a n-type over the superjunction structure, wherein the superjunction structure is positioned opposed to the MOSFET structure at a position at which carriers flow out from the source regions through channel regions thereof.

10. The semiconductor superjunction device according to claim 2, wherein the repetitive structure is layered perpendicular to a principal surface of the semiconductor substrate and are aligned so that a cross-sectional pattern on a plane taken parallel with the principal surface comprises a plurality of rectangles arranged in parallel.

11. The semiconductor superjunction device according to claim 2, wherein an impurity in the n-type region of the superjunction structure is one of antimony or arsenic.

12. The semiconductor superjunction device according to claim 1, wherein, with the impurity concentration in the n-type region taken as $n_2$, the width of the n-type region in the direction perpendicular to the drift direction of carriers in the n-type region taken as dn, the impurity concentration in the p-type region taken as $p_1$, the width of the p-type region in the direction perpendicular to the drift direction of carriers in the p-type region taken as dp, the width of the first intrinsic semiconductor region taken as di, (dn+dp+2×di)/2 set as (dn+dp+2×di)/2=d', and the donor concentration Nd in the superjunction structure given as $$Nd = 1.41 \times 10^{12} \cdot \alpha^{7/6} \cdot d'^{-7/6} (cm^{-3}),$$

where α represents a coefficient (0<α<1) and d represents the width (the width in the direction perpendicular to the drift direction) of a current path (in the n-type semiconductor region) in the superjunction structure, the impurity concentration $n_2$ in the n-type semiconductor region and the impurity concentration $p_1$ in the p-type semiconductor region satisfy $n_2 \leq d' \times Nd/dn$ and $p_1 \leq d' \times Nd/dp$, respectively, and satisfy $n_2 \times dn = p_1 \times dp$.

13. The semiconductor superjunction device according to claim 3 wherein the unit of the repetitive structure has a total width equal to or less than 0.5 µm.

14. The semiconductor superjunction device according to claim 12, wherein the repetitive structure is layered perpendicular to a principal surface of the semiconductor substrate and are aligned so that a cross-sectional pattern on a plane taken parallel with the principal surface comprises a plurality of rectangles arranged in parallel.

15. The semiconductor superjunction device according to claim 12, wherein an impurity in the n-type region of the superjunction structure is one of antimony or arsenic.

16. The semiconductor superjunction device as claimed in claim 1, wherein the unit of the repetitive structure has a total width equal to or less than 0.5 µm.

17. The semiconductor superjunction device according to claim 1, wherein the repetitive structure is layered perpendicular to a principal surface of the semiconductor substrate and are aligned so that a cross-sectional pattern on a plane taken parallel with the principal surface comprises a plurality of rectangles arranged in parallel.

18. The semiconductor superjunction device according to claim 1, wherein an impurity in the n-type region of the superjunction structure is one of antimony or arsenic.

19. A semiconductor superjunction device comprising:
a semiconductor substrate;
a superjunction structure having a cross-sectional pattern on a plane taken parallel with a principal surface of the semiconductor substrate comprising concentric circles with a plurality of ring-shaped regions; and
a channel stopper region arranged on the outside of the column structure, wherein the superjunction structure comprises:
one of an n-type or a p-type region having a ring-shaped cross section, a first intrinsic semiconductor region having a ring-shaped cross section, and the other of the n-type or p-type region having a ring-shaped cross section, arranged in the order from a central section toward a peripheral section; and
a second intrinsic semiconductor region having substantially circular cross section at the central section,
wherein one of the n-type or p-type region forms the outermost peripheral section.

* * * * *